United States Patent
You et al.

(10) Patent No.: US 10,629,742 B2
(45) Date of Patent: Apr. 21, 2020

(54) SEMICONDUCTOR DEVICE AND METHOD OF FABRICATING THE SAME

(71) Applicant: SAMSUNG ELECTRONICS CO., LTD., Suwon-si, Gyeonggi-do (KR)

(72) Inventors: Jung Gun You, Ansan-si (KR); Dong Hyun Kim, Hwaseong-si (KR); Byoung-Gi Kim, Suwon-si (KR); Yun Suk Nam, Yongin-si (KR); Yeong Min Jeon, Hwaseong-si (KR); Sung Chul Park, Seongnam-si (KR); Dae Won Ha, Seoul (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 16/044,691

(22) Filed: Jul. 25, 2018

(65) Prior Publication Data
US 2019/0189804 A1   Jun. 20, 2019

(30) Foreign Application Priority Data
Dec. 18, 2017   (KR) ........................ 10-2017-0174149

(51) Int. Cl.
*H01L 29/78*   (2006.01)
*H01L 29/06*   (2006.01)
(Continued)

(52) U.S. Cl.
CPC ........ *H01L 29/7855* (2013.01); *H01L 21/762* (2013.01); *H01L 21/76229* (2013.01);
(Continued)

(58) Field of Classification Search
CPC ........... H01L 29/66795; H01L 29/6681; H01L 29/0642; H01L 29/785; H01L 29/7831; H01L 29/7855; H01L 21/762; H01L 21/8232; H01L 21/238; H01L 21/823481; H01L 21/823456; H01L 21/823431;
(Continued)

(56) References Cited

U.S. PATENT DOCUMENTS 8,847,295 B2 * 9/2014 Shieh .................. H01L 29/7855
257/287
9,034,723 B1   5/2015 Shieh et al.
(Continued)

FOREIGN PATENT DOCUMENTS

KR   10-2015-0045379 A   4/2015
KR   10-2015-0060589 A   6/2015
(Continued)

*Primary Examiner* — Natalia A Gondarenko
(74) *Attorney, Agent, or Firm* — Lee IP Law, P.C.

(57) ABSTRACT

A semiconductor device includes first and second fin patterns on a substrate and extending apart from each other, a field insulating film on the substrate and surrounding parts of the first and second fin patterns, a first gate structure on the first fin pattern and intersecting the first fin pattern, a second gate structure on the second fin pattern and intersecting the second fin pattern, and a separating structure protruding from a top surface of the field insulating film and separating the first and second gate structures, the field insulating film and the separating structure including a same insulating material.

18 Claims, 47 Drawing Sheets

(51) Int. Cl.
*H01L 29/66* (2006.01)
*H01L 21/762* (2006.01)
*H01L 21/8234* (2006.01)
*H01L 21/8238* (2006.01)
*H01L 23/532* (2006.01)
*H01L 27/088* (2006.01)
*H01L 29/165* (2006.01)

(52) U.S. Cl.
CPC ............... *H01L 21/823431* (2013.01); *H01L 21/823481* (2013.01); *H01L 21/823821* (2013.01); *H01L 21/823864* (2013.01); *H01L 23/5329* (2013.01); *H01L 27/0886* (2013.01); *H01L 29/0642* (2013.01); *H01L 29/6681* (2013.01); *H01L 21/823437* (2013.01); *H01L 29/165* (2013.01); *H01L 29/7848* (2013.01)

(58) Field of Classification Search
CPC ..... H01L 21/823821; H01L 21/823864; H01L 21/82385; H01L 21/823878; H01L 23/5329; H01L 29/41791; H01L 29/0649; H01L 29/0653; H01L 29/0657; H01L 29/1054; H01L 29/161; H01L 29/511; H01L 29/517; H01L 29/165; H01L 29/66636; H01L 29/66545; H01L 29/7848; H01L 29/7849; H01L 29/7851; H01L 27/0886; H01L 27/0924; H01L 27/10826; H01L 27/10879; H01L 21/76; H01L 21/76281; H01L 21/76283; H01L 21/76235; H01L 21/76227; H01L 21/76224; H01L 21/76221; H01L 21/76202; H01L 21/823468; H01L 23/53295

USPC ....... 257/365, 328, 308, 287, 288, 324, 331, 257/368, 401; 438/283
See application file for complete search history.

(56) References Cited

U.S. PATENT DOCUMENTS

| | | |
|---|---|---|
| 9,437,497 B2 | 9/2016 | Shieh et al. |
| 9,443,768 B2 | 9/2016 | Shieh et al. |
| 9,490,176 B2 | 11/2016 | Chang et al. |
| 9,595,475 B2 | 3/2017 | Liaw |
| 9,679,815 B2 | 6/2017 | Lee et al. |
| 9,741,728 B2 | 8/2017 | Chuang et al. |
| 9,741,825 B1 | 8/2017 | Tsai et al. |
| 9,741,843 B2 | 8/2017 | Nishimura |
| 9,818,649 B2 | 11/2017 | Chang et al. |
| 9,847,329 B2 | 12/2017 | Wen et al. |
| 9,947,756 B2* | 4/2018 | Li .................. H01L 29/0649 |
| 2014/0252486 A1* | 9/2014 | Lin, Jr. ............. H01L 29/66795 257/365 |
| 2015/0035081 A1 | 2/2015 | Cheng et al. |
| 2015/0115334 A1* | 4/2015 | Liaw ................ H01L 29/7849 257/288 |
| 2015/0228647 A1* | 8/2015 | Chang ............. H01L 21/823431 257/401 |

FOREIGN PATENT DOCUMENTS

| | | |
|---|---|---|
| KR | 10-2016-0028934 A | 3/2016 |
| KR | 10-2016-0045532 A | 4/2016 |
| KR | 10-2016-0065747 A | 6/2016 |
| KR | 10-2016-0123032 A | 10/2016 |

* cited by examiner

SEMICONDUCTOR DEVICE AND METHOD OF FABRICATING THE SAME

CROSS-REFERENCE TO RELATED APPLICATION

Korean Patent Application No. 10-2017-0174149, filed on Dec. 18, 2017, in the Korean Intellectual Property Office, and entitled: "Semiconductor Device and Method of Fabricating the Same," is incorporated by reference herein in its entirety.

BACKGROUND

1. Field

Embodiments relate to a semiconductor device and a method of fabricating the same.

2. Description of the Related Art

As a scaling technique for increasing the density of integrated circuit devices, a multi-gate transistor has been considered. In the multi-gate transistor, a fin- or nanowire-shaped silicon body may be formed on a substrate, and a gate may be formed on the surface of the silicon body.

A multi-gate transistor may enable scaling by using a three-dimensional (3D) channel. Also, an improved current control capability may be provided without the need to increase the gate length of the multi-gate transistor. Also, a short channel effect (SCE), in which the electric potential of a channel region is affected by a drain voltage, may be effectively suppressed.

SUMMARY

Embodiments are directed to a semiconductor device including first and second fin patterns on a substrate and extending apart from each other, a field insulating film on the substrate and surrounding parts of the first and second fin patterns, a first gate structure on the first fin pattern and intersecting the first fin pattern, a second gate structure on the second fin pattern and intersecting the second fin pattern, and a separating structure protruding from a top surface of the field insulating film and separating the first and second gate structures, the field insulating film and the separating structure including a same insulating material.

Embodiments are also directed to a semiconductor device including first and second fin patterns on a substrate and extending apart from each other, a field insulating film on the substrate and surrounding parts of the first and second fin patterns over the substrate, a first gate structure on the first fin pattern and intersecting the first fin pattern, a second gate structure on the second fin pattern and intersecting the second fin pattern, a third gate structure on the first fin pattern and intersecting the first fin pattern, and extending apart from the first gate structure, a fourth gate structure on the second fin pattern and intersecting the second fin pattern, and extending apart from the second gate structure, and a separating structure between the first and second fin patterns and separating the first and second gate structures, and separating the third and fourth gate structures, the field insulating film and the separating structure being a single integral body with each other.

Embodiments are also directed to a semiconductor device including first and second fin patterns on a substrate and extending apart from each other, a first gate structure on the first fin pattern and intersecting the first fin pattern, a second gate structure on the second fin pattern and intersecting the second fin pattern, a separating structure on the substrate and separating the first and second gate structures, and a spacer that extends along sidewalls of the first fin pattern, along sidewalls of the second fin pattern, and along sidewalls of the separating structure.

BRIEF DESCRIPTION OF THE DRAWINGS

Features will become apparent to those of skill in the art by describing in detail example embodiments with reference to the attached drawings in which.

DETAILED DESCRIPTION

Example embodiments will be apparent to those of skill in the art from the detailed description, the drawings, and the claims. Embodiments are not restricted to those set forth herein.

Semiconductor devices according to some example embodiments will hereinafter be described with reference to FIGS. 1 through 16B.

Figure 1:
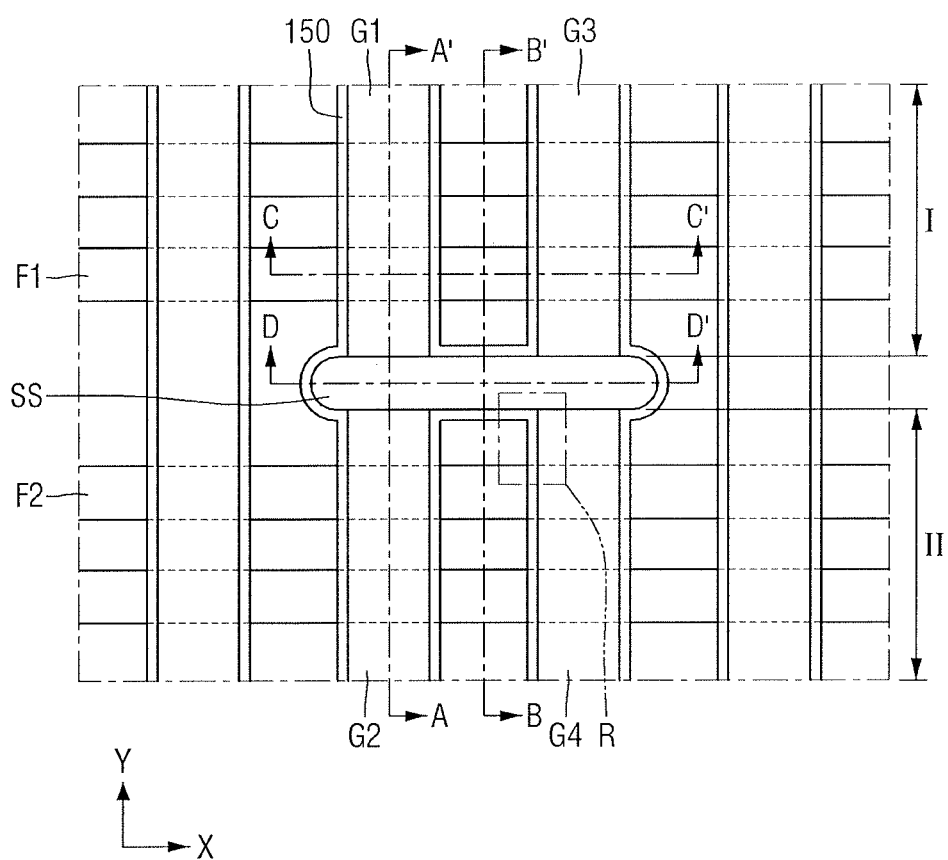
FIG. 1 illustrates a layout view of a semiconductor device according to some example embodiments.
Figure 2:
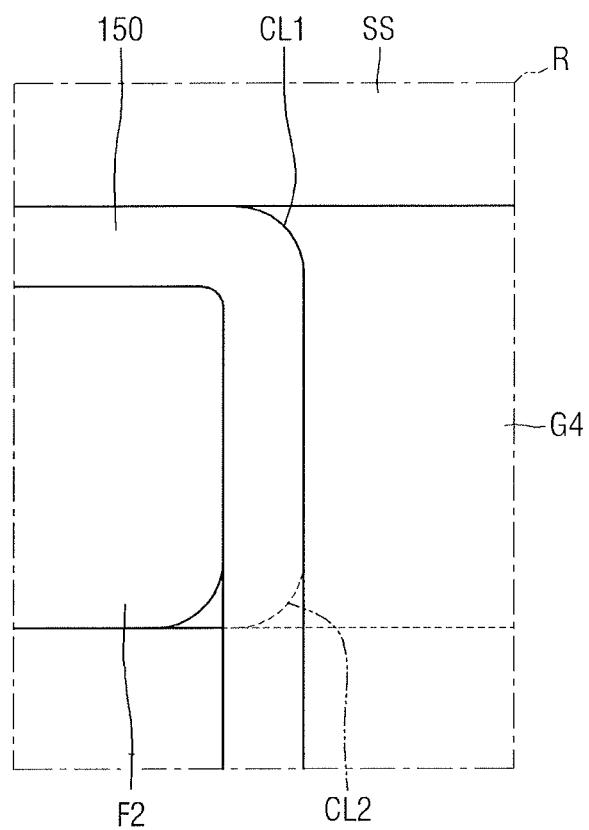
FIG. 2 illustrates an enlarged view of a region R of FIG. 1.
Figure 3:
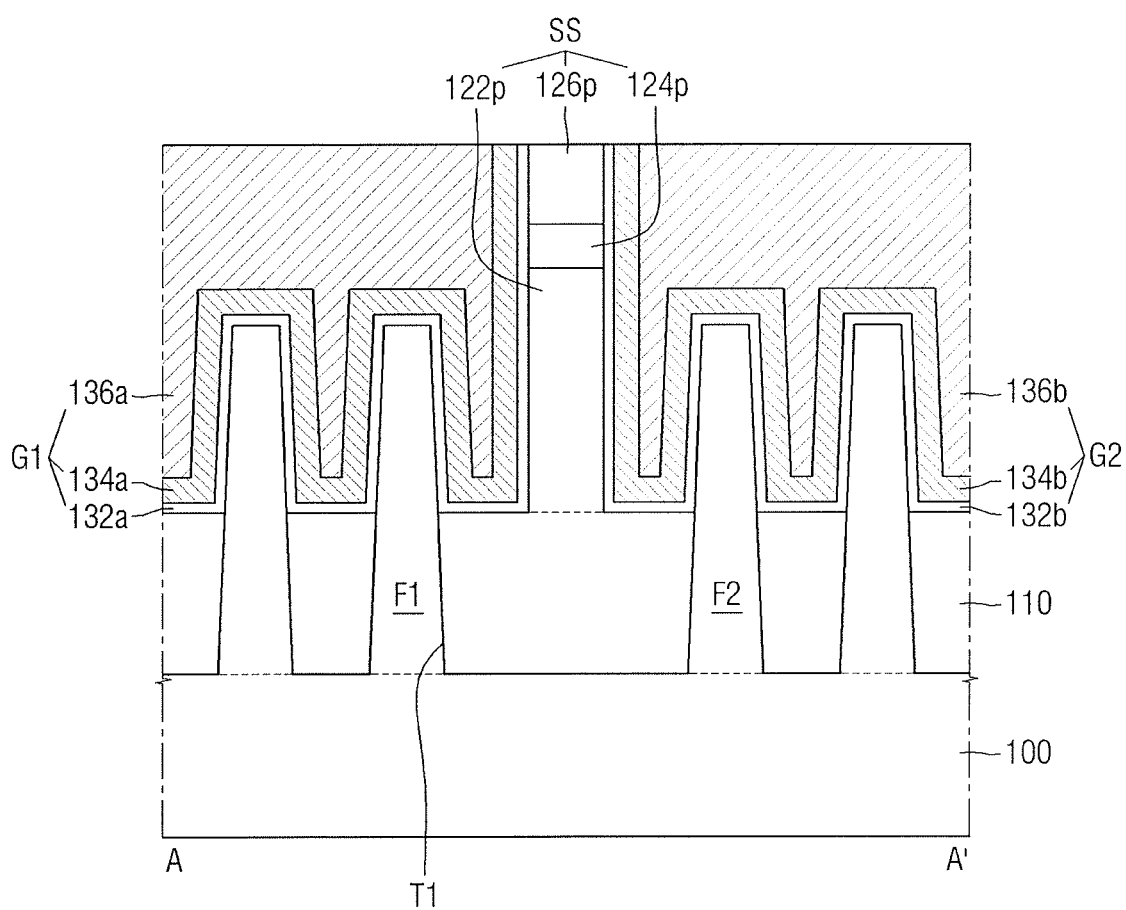
FIG. 3 illustrates a cross-sectional view taken along line A-A' of FIG. 1.
Figure 4:
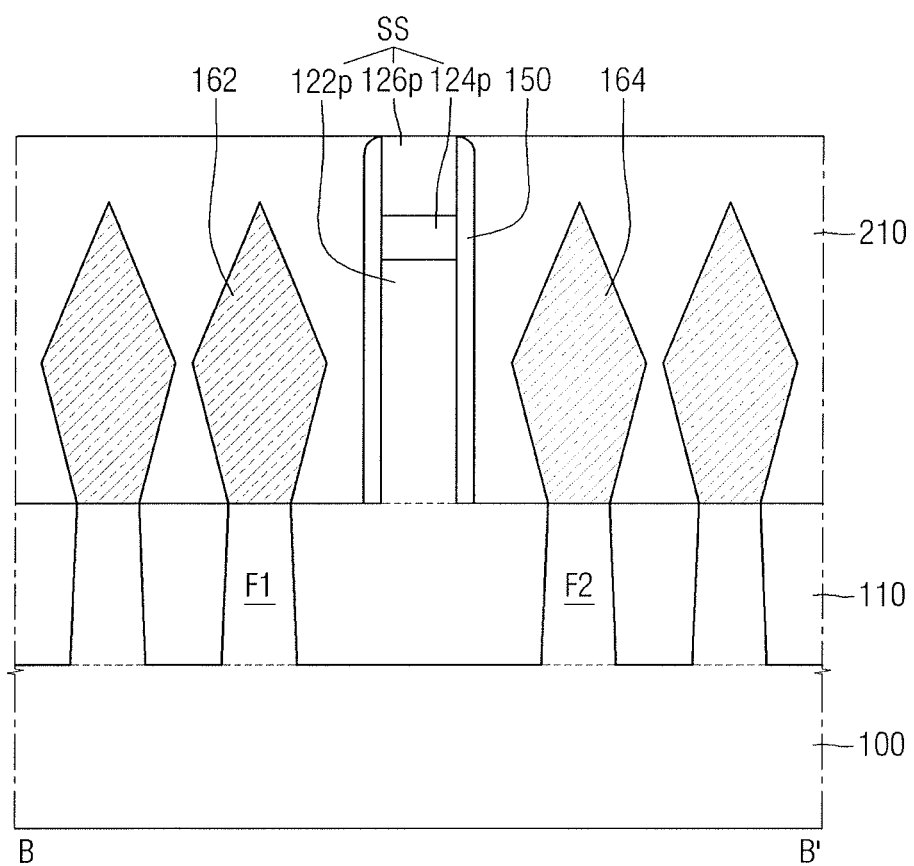
FIG. 4 illustrates a cross-sectional view taken along line B-B' of FIG. 1.
Figure 5:
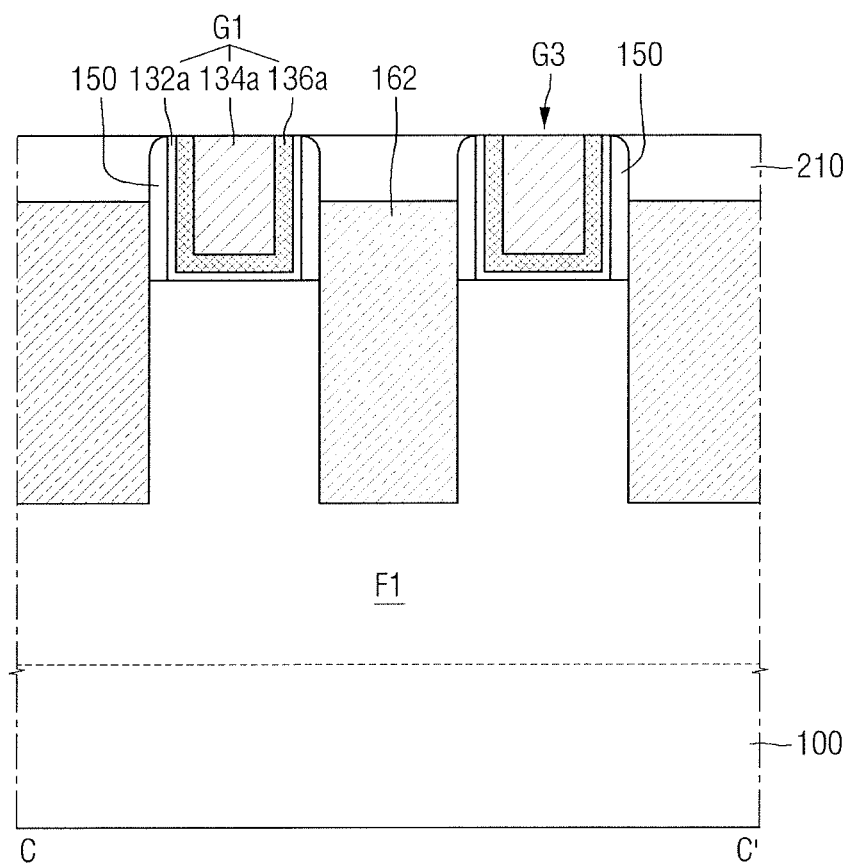
FIG. 5 illustrates a cross-sectional view taken along line C-C' of FIG. 1.
Figure 6:
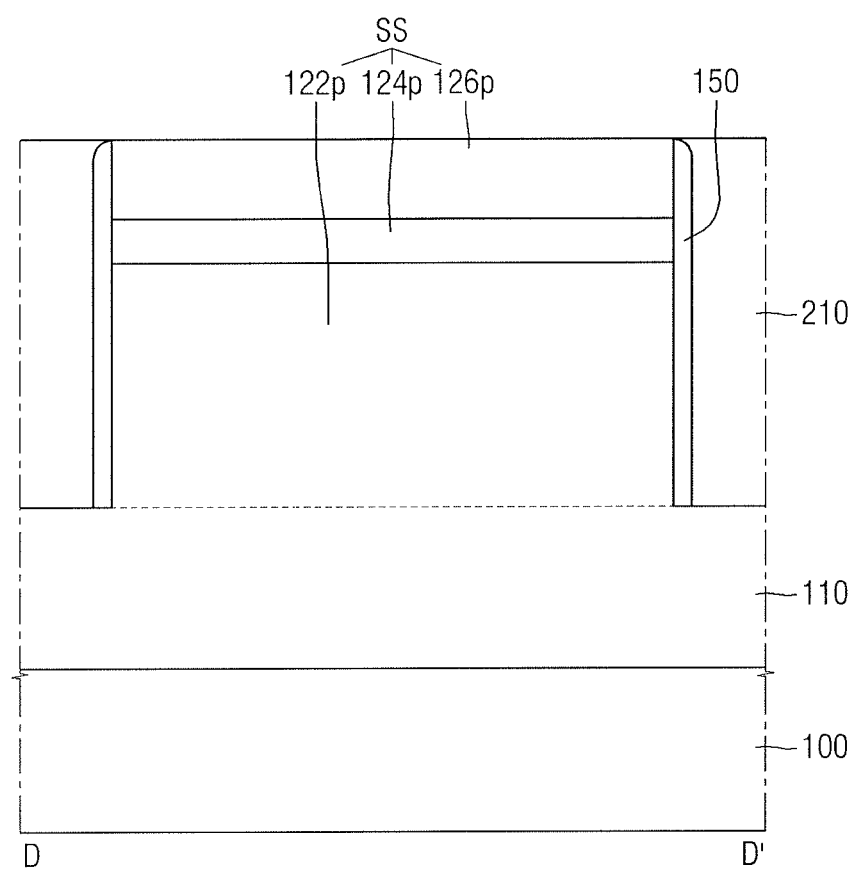
FIG. 6 illustrates a cross-sectional view taken along line D-D' of FIG. 1.

FIG. 1 is a layout view of a semiconductor device according to some example embodiments. FIG. 2 is an enlarged view of a region R of FIG. 1. FIG. 3 is a cross-sectional view taken along line A-A' of FIG. 1. FIG. 4 is a cross-sectional view taken along line B-B' of FIG. 1. FIG. 5 is a cross-sectional view taken along line C-C' of FIG. 1. FIG. 6 is a cross-sectional view taken along line D-D' of FIG. 1.

Referring to FIGS. 1 through 6, a semiconductor device according to some example embodiments includes a substrate 100, a first fin pattern F1, a second fin pattern F2, a field insulating film 110, a first gate structure G1, a second gate structure G2, a third gate structure G3, a fourth gate structure G4, a separating structure SS, a spacer 150, a first epitaxial pattern 162, a second epitaxial pattern 164, and a first interlayer insulating film 210.

The substrate 100 may include, for example, bulk silicon or a silicon-on-insulator (SOI). The substrate 100 may be a silicon substrate or may be a substrate including other materials such as silicon germanium, indium antimonide, a lead tellurium compound, indium arsenide, indium phosphide, gallium arsenide, or gallium antimonide. In another implementation, the substrate 100 may be a base substrate having an epitaxial layer formed thereon.

The substrate 100 may include first and second regions I and II. In some example embodiments, semiconductor devices of different conductivity types may be formed in the first and second regions I and II. In an example, a P-type metal oxide semiconductor (PMOS) transistor may be formed in the first region I, and an N-type metal oxide semiconductor (NMOS) transistor may be formed in the second region II. In another example, semiconductor devices of the same conductivity type may be formed in the first and second regions I and II.

The first and second fin patterns F1 and F2 may extend apart from each other on the substrate 100. In an example, the first fin pattern F1 may be formed in the first region I of the substrate 100, and the second fin pattern F2 may be formed in the second region II of the substrate 100.

The first and second fin patterns F1 and F2 may protrude from the substrate 100 to extend longitudinally over the substrate 100. In an example, each of the first and second fin patterns F1 and F2 may have short sides and long sides. The long sides of each of the first and second fin patterns F1 and F2 are illustrated as extending along a first direction X. Thus, the first and second fin patterns F1 and F2 may be elongated along the first direction X over the substrate 10.

The first and second fin patterns F1 and F2 may be parts of the substrate 100 and may include epitaxial layers grown from the substrate 100. The first and second fin patterns F1 and F2 may include, for example, silicon (Si) or germanium (Ge), which is a semiconductor element. The first and second fin patterns F1 and F2 may include a compound semiconductor, for example, a Group IV-IV compound semiconductor or a Group III-V compound semiconductor.

For example, the first and second fin patterns F1 and F2 include, for example, a Group IV-IV group compound such as a binary or ternary compound including two or more of carbon (C), Si, Ge, and tin (Sn), or a compound prepared by doping the binary or ternary compound with a Group IV group. The first and second fin patterns F1 and F2 may include, for example, a Group III-V compound semiconductor such as one of a binary compound, a ternary compound, and a quaternary compound formed by combining at least one of aluminum (Al), gallium (Ga), and indium (In), which are Group III elements, with one of phosphorous (P), arsenic (As), and antimony (Sb), which are Group V elements. In some example embodiments, the first and second fin patterns F1 and F2 may be silicon fin patterns including Si.

The field insulating film 110 may surround parts of the first and second fin patterns F1 and F2 over the substrate 100. In an example, the substrate 100 may include a first trench T1, which may be defined by opposing sidewalls of the first and second fin patterns F1 and F2. The field insulating film 110 may fill a part of the first trench T1 between the first and second fin patterns F1 and F2.

FIG. 5 illustrates that the top surface of the field insulating film 110 has the same height as parts of the top surfaces of the first and second fin patterns F1 and F2. In another implementation, the first and second fin patterns F1 and F2 may, for example, protrude beyond the top surface of the field insulating film 110.

The first gate structure G1 may be formed on the first fin pattern F1 to intersect the first fin pattern F1. In an example, the first gate structure G1 may extend longitudinally in a second direction Y over the first fin pattern F1.

The second gate structure G2 may be formed on the second fin pattern F2 to intersect the second fin pattern F2. In an example, the second gate structure G2 may extend longitudinally in the second direction Y over the second fin pattern F2.

The third gate structure G3 may extend apart from the first gate structure G1. The third gate structure G3 may be formed on the first fin pattern F1 to intersect the first fin pattern F1. In an example, the third gate structure G3 may extend longitudinally in the second direction Y over the first fin pattern F1.

The fourth gate structure G4 may extend apart from the second gate structure G2. The fourth gate structure G4 may be formed on the second fin pattern F2 to intersect the second fin pattern F2. In an example, the fourth gate structure G4 may extend longitudinally in the second direction Y over the second fin pattern F2.

Each of the first through fourth gate structures G1 through G4 may include a gate insulating film and metal films. In an example, the first gate structure G1 may include a first gate insulating film 132a and first and second metal films 134a and 136a. As illustrated in FIGS. 3 and 5, the first and second metal films 134a and 136a may be stacked on the first gate insulating film 132a. In an example, the second gate structure G2 may include a second gate insulating film 132b and third and fourth metal films 134b and 136b. As illustrated in FIGS. 3 and 5, the third and fourth metal films 134b and 136b may be stacked on the second gate insulating film 132b.

The first and second gate insulating films 132a and 132b may be formed on the same level. As used herein, the expression "formed on the same level" means that elements are formed by the same manufacturing process. The first and third metal films 134a and 134b may be formed on the same level. The second and fourth metal films 136a and 136b may be formed on the same level.

In some example embodiments, the first gate insulating film 132a may extend along the top surface and the sidewalls of the first fin pattern F1, the top surface of the field insulating film 110, and the sidewalls of the separating structure SS. Similarly, the second gate insulating film 132b may extend along the top surface and the sidewalls of the second fin pattern F2, the top surface of the field insulating film 110, and the sidewalls of the separating structure SS.

The first and second gate insulating films 132a and 132b may include a high-k material having a higher dielectric constant than a silicon oxide film. In an example, the first and second gate insulating films 132a and 132b may include one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, a combination thereof, etc.

In some example embodiments, the first and third metal films 134a and 134b may control a work function. The second and fourth metal films 136a and 136b may fill spaces formed by the first and third metal films 134a and 134b, respectively.

The first and third metal films 134a and 134b may include one or more of, for example, TiN, TaN, TiC, TaC, TiAl, TiAlC, etc. The second and fourth metal films 136a and 136b may include one or more of, for example, tungsten (W), Al, TiN, cobalt (Co), etc. The first, second, third, and fourth metal films 134*a*, 136*a*, 134*b*, and 136*b* may include a non-metal material such as silicon or silicon germanium. The first, second, third, and fourth metal films 134*a*, 136*a*, 134*b*, and 136*b* may be formed by, for example, a replacement process.

The separating structure SS may protrude from the top surface of the field insulating film 110. The separating structure SS may be formed between the first and second regions I and II of the substrate 100. In an example, the separating structure SS may be formed between the first and second fin patterns F1 and F2.

The separating structure SS may separate the first and second gate structures G1 and G2 and may separate the third and fourth gate structures G3 and G4. The separating structure SS may include an insulating material. Accordingly, the first and second gate structures G1 and G2 may be electrically insulated, and the third and fourth gate structures G3 and G4 may be electrically insulated.

The separating structure SS may separate the first through fourth gate structures G1 through G4. Thus, the first through fourth gate structures G1 through G4 may be placed in contact with the sidewalls of the separating structure SS. The width of sidewalls of the first through fourth gate structures G1 through G4 that are adjacent to the separating structure SS may increase closer to the separating structure SS. The width of the first through fourth gate structures G1 through G4 refers to the width of the first through fourth gate structures G1 through G4 in the first direction X. The width of the first through fourth gate structures G1 through G4 will hereinafter be described in detail, taking the fourth gate structure G4 as an example.

In an example, as illustrated in FIG. 2, the sidewall of the fourth gate structure G4 that is adjacent to the separating structure SS may include a first concave line CL1. The first concave line CL1 may be formed such that the width of the fourth gate structure G4 may increase closer to the separating structure SS.

The fourth gate structure G4 may be formed to have the shape illustrated in FIG. 2 by, for example, forming the fourth gate structure G4 after forming the separating structure SS. In an example, after the formation of the separating structure SS, the fourth gate structure G4 may be formed, through patterning, in a direction that intersects the separating structure SS. Depending on the characteristics of the patterning for forming the fourth gate structure G4, a part of the fourth gate structure G4 that is adjacent to the separating structure SS may not be patterned sharply. As a result, the fourth gate structure G4 may be formed to have the first concave line CL1.

The first through fourth gate structures G1 through G4 may intersect the first or second fin pattern F1 or F2. Thus, the first through fourth gate structures G1 through G4 may be placed in contact with the first or second fin pattern F1 or F2. The width of sidewalls of the first through fourth gate structures G1 through G4 that are adjacent to the first or second fin pattern F1 or F2 may increase closer to the first or second fin pattern F1 or F2. As described above, the width of the first through fourth gate structures G1 through G4 refers to the width of the first through fourth gate structures G1 through G4 in the first direction X. The width of the first through fourth gate structures G1 through G4 will hereinafter be described in further detail, taking the fourth gate structure G4 as an example.

In an example, as illustrated in FIG. 2, the sidewall of the fourth gate structure G4 that is adjacent to the second fin pattern F2 may include a second concave line CL2. The second concave line CL2 may be formed such that the width of the fourth gate structure G4 may increase closer to the second fin pattern F2.

The fourth gate structure G4 may be formed to have the shape illustrated in FIG. 2 by forming the fourth gate structure G4 after forming the second fin pattern F2. In an example, after the formation of the second fin pattern F2, the fourth gate structure G4 may be formed, through patterning, in a direction that intersects the second fin pattern F2. Depending on the characteristics of the patterning for forming the fourth gate structure G4, a part of the fourth gate structure G4 that is adjacent to the second fin pattern F2 may not be patterned sharply. As a result, the fourth gate structure G4 may be formed to have the second concave line CL2.

The separating structure SS may be formed in one integral body with the field insulating film 110. In an example, the separating structure SS and the field insulating film 110 may be formed on the same level. Accordingly, the field insulating film 110 and the separating structure SS may include the same insulating material. In an example, the field insulating film 110 and the separating structure SS may include the same oxide.

In some example embodiments, the separating structure SS may protrude laterally beyond the sidewalls of each of the first through fourth gate structures G1 through G4. In an example, the separating structure SS may protrude laterally beyond the sidewalls of the first gate structure G1 and the sidewalls of the second gate structure G2. FIG. 1 illustrates that the top surface of the separating structure SS is elliptical in shape, as an example. In another implementation, the top surface of the separating structure SS may be rectangular in shape.

In an example, the separating structure SS may extend in the second direction Y. In an example, as illustrated in FIG. 1, the separating structure SS may extend in the second direction Y to separate the first and second gate structures G1 and G2 and to separate the third and fourth gate structures G3 and G4. In another implementation, the separating structure SS may separate the first and second gate structures G1 and G2, but may not separate the third and fourth gate structures G3 and G4. In another implementation, the separating structure SS may separate the third and fourth gate structures G3 and G4, but may not separate the first and second gate structures G1 and G2.

In some example embodiments, the top surface of the separating structure SS may be disposed substantially on the same plane as the top surfaces of the first and second gate structures G1 and G2. In an example, the top surface of the separating structure SS and the top surfaces of the first and second gate structures G1 and G2 may be disposed substantially on the same plane by planarization such as chemical mechanical polishing (CMP).

In some example embodiments, the separating structure SS may include first, second, and third insulating patterns 122*p*, 124*p*, and 126*p*, which are sequentially stacked on the field insulating film 110. The bottom surface of the first insulating pattern 122*p* may be placed in contact with the top surface of the field insulating film 110.

The second insulating pattern 124*p* may include a different material from the first insulating pattern 122*p*. The third insulating pattern 126*p* may include a different material from the second insulating pattern 124*p*. In some example embodiments, the first and third insulating patterns 122*p* and 126*p* may include an oxide, and the second insulating pattern 124*p* may include a nitride.

The separating structure SS and the field insulating film 110 may be formed in one integral body with each other.

Thus, the first insulating pattern 122p and the field insulating film 110 may include substantially the same insulating material. In an example, the first insulating pattern 122p and the field insulating film 110 may include substantially the same oxide.

In some example embodiments, the second insulating pattern 124p may be disposed higher than the first and second fin patterns F1 and F2. In an example, the top surface of the second insulating pattern 124P may be higher than the top surfaces of the first and second fin patterns F1 and F2.

The spacer 150 may be formed on the sidewalls of each of the first through fourth gate structures G1 through G4 and the sidewalls of the separating structure SS. In an example, as illustrated in FIGS. 1 and 4 through 6, the spacer 150 may extend along the sidewalls of the first gate structure G1, the sidewalls of the second gate structure G2, and the sidewalls of the separating structure SS.

The spacer 150 is illustrated as being a single-layer film, as an example. In another implementation, the spacer 150 may be formed as a multilayer film.

In an example, the spacer 150 may include silicon nitride (SiN), silicon oxynitride (SiON), silicon oxide ($SiO_2$), silicon oxycarbonitride (SiOCN), or a combination thereof. In another example, the spacer 150 may include a low-k material having a lower dielectric constant than a silicon oxide film.

Each of the first and second epitaxial patterns 162 and 164 may be formed on fin patterns on both sidewalls of gate structures. In an example, the first epitaxial pattern 162 may be formed on the first fin pattern F1 between the first and third gate structures G1 and G3. In an example, the second epitaxial pattern 164 may be formed on the second fin pattern F2 between the second and fourth gate structures G2 and G4.

The first and second epitaxial patterns 162 and 164 may be insulated from the first through fourth gate structures G1 through G4. The first and second epitaxial patterns 162 and 164 may perform the functions of sources/drains of transistors.

In some example embodiments, the first and second epitaxial patterns 162 and 164 may be elevated sources/drains. Thus, uppermost parts of the first and second epitaxial patterns 162 and 164 may protrude beyond the top surfaces of the first and second fin patterns F1 and F2. In some example embodiments, the first and second epitaxial patterns 162 and 164 may be sources/drains shared between a plurality of gate electrodes.

The first and second epitaxial patterns 162 and 164 are illustrated as being single-layer films, as an example. In another implementation, the first and second epitaxial patterns 162 and 164 may be formed as multilayer films.

In some example embodiments, the first and second epitaxial patterns 162 and 164 may be separated by the separating structure SS. In an example, the separating structure SS may be interposed between the first and second epitaxial patterns 162 and 164. The separating structure SS may include an insulating material. Thus, the first and second epitaxial patterns 162 and 164 may be electrically insulated.

The first and second epitaxial patterns 162 and 164 are illustrated as having a pentagonal cross-sectional shape, as an example. In another implementation, the first and second epitaxial patterns 162 and 164 may have various other cross-sectional shapes such as, for example, a diamond or hexagonal cross-sectional shape.

The first and second epitaxial patterns 162 and 164 may include impurities of different conductivity types or may include impurities of the same conductivity type.

In an example, in a case where a PMOS transistor is formed in the first or second region I or II, the first or second epitaxial pattern 162 or 164 may include P-type impurities or impurities for preventing the diffusion of P-type impurities. In an example, the first or second epitaxial pattern 162 or 164 may include one or more of boron (B), C, In, Ga, Al, or a combination thereof.

Also, in a case where a PMOS transistor is formed in the first or second region I or II, the first or second epitaxial pattern 162 or 164 may include a compressive stress material. In an example, in a case where the first or second fin pattern F1 or F2 includes Si, the first or second epitaxial pattern 162 or 164 may include a material having a larger lattice constant than Si, such as, for example, SiGe. The compressive stress material may apply compressive stress to the first or second fin pattern F1 or F2 and may thus improve the mobility of carriers in a channel region.

On the other hand, in a case where an NMOS transistor is formed in the first or second region I or II, the first or second epitaxial pattern 162 or 164 may include N-type impurities or impurities for preventing the diffusion of N-type impurities. In an example, the first or second epitaxial pattern 162 or 164 may include one or more of phosphorus (P), Sb, As, or a combination thereof.

Also, in a case where an NMOS transistor is formed in the first or second region I or II, the first or second epitaxial pattern 162 or 164 may include a tensile stress material. In an example, in a case where the first or second fin pattern F1 or F2 includes Si, the first or second epitaxial pattern 162 or 164 may include a material having a smaller lattice constant than Si, such as, for example. SiC. The tensile stress material may apply tensile stress to the first or second fin pattern F1 or F2 and may thus improve the mobility of carriers in a channel region.

The first interlayer insulating film 210 may be formed to fill the surroundings of the first through fourth gate structures G1 through G4, the separating structure SS, and the first and second epitaxial patterns 162 and 164. FIGS. 4 through 6 illustrate that the top surface of the first interlayer insulating film 210 is disposed on the same plane as the top surfaces of the first and second gate structures G1 and G2 and the top surface of the separating structure SS, as an example.

The first interlayer insulating film 210 may include one or more of, for example, an oxide film, a nitride film, and an oxynitride film, as an example.

FIGS. 7A through 9 are cross-sectional views taken along line A-A' of FIG. 1. For convenience, redundant descriptions of the example embodiment of FIGS. 1 through 6 may be omitted.

Figure 7A:
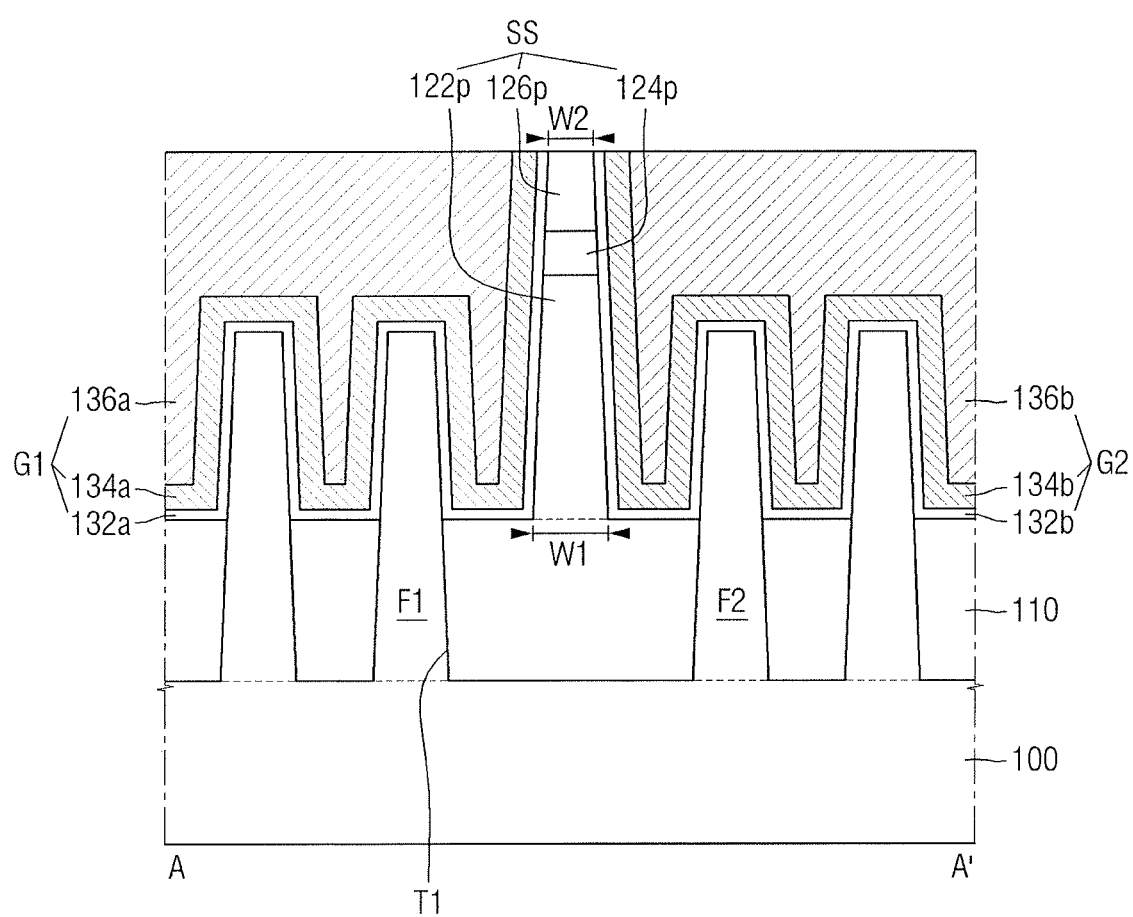
FIGS. 7A through 9 illustrate cross-sectional views taken along line A-A' of FIG. 1.

Referring to FIG. 7A, the width of a separating structure SS may gradually decrease away from the top surface of a field insulating film 110. The width of the separating structure SS refers to the width of the separating structure SS in a direction in which the first and second gate structures G1 and G2 extend.

In an example, the width of the bottom surface of the separating structure SS, i.e., a first width W1, may be larger than the width of the top surface of the top surface of the separating structure SS, i.e., a second width W2. Accordingly, the sidewalls of the separating structure SS may have an inclination with respect to the top surface of the field insulating film 110.

The separating structure SS may be formed to have the shape illustrated in FIG. 7A by using the characteristics of an etching process for forming the separating structure SS, and this will be described below with reference to FIGS. 29 through 34.

Figure 7B:
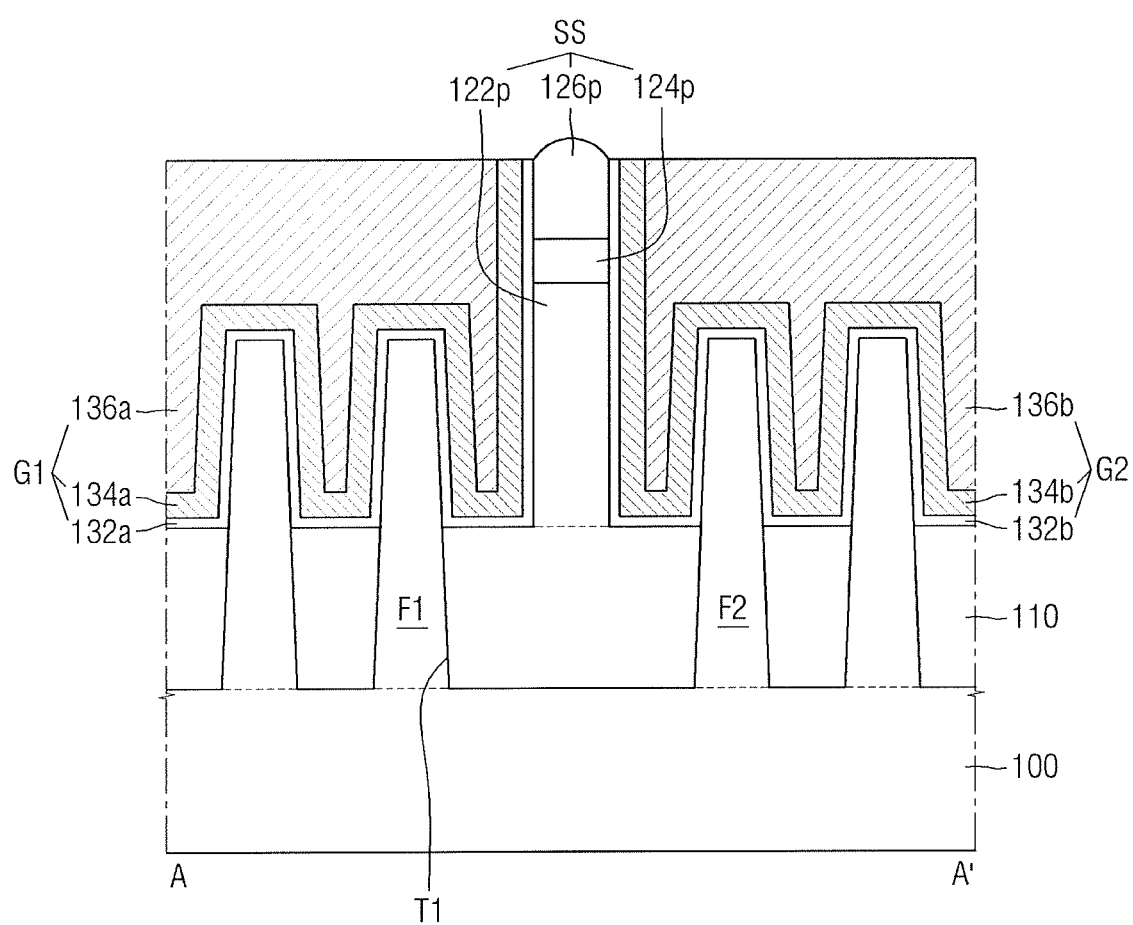
Figure 7C:
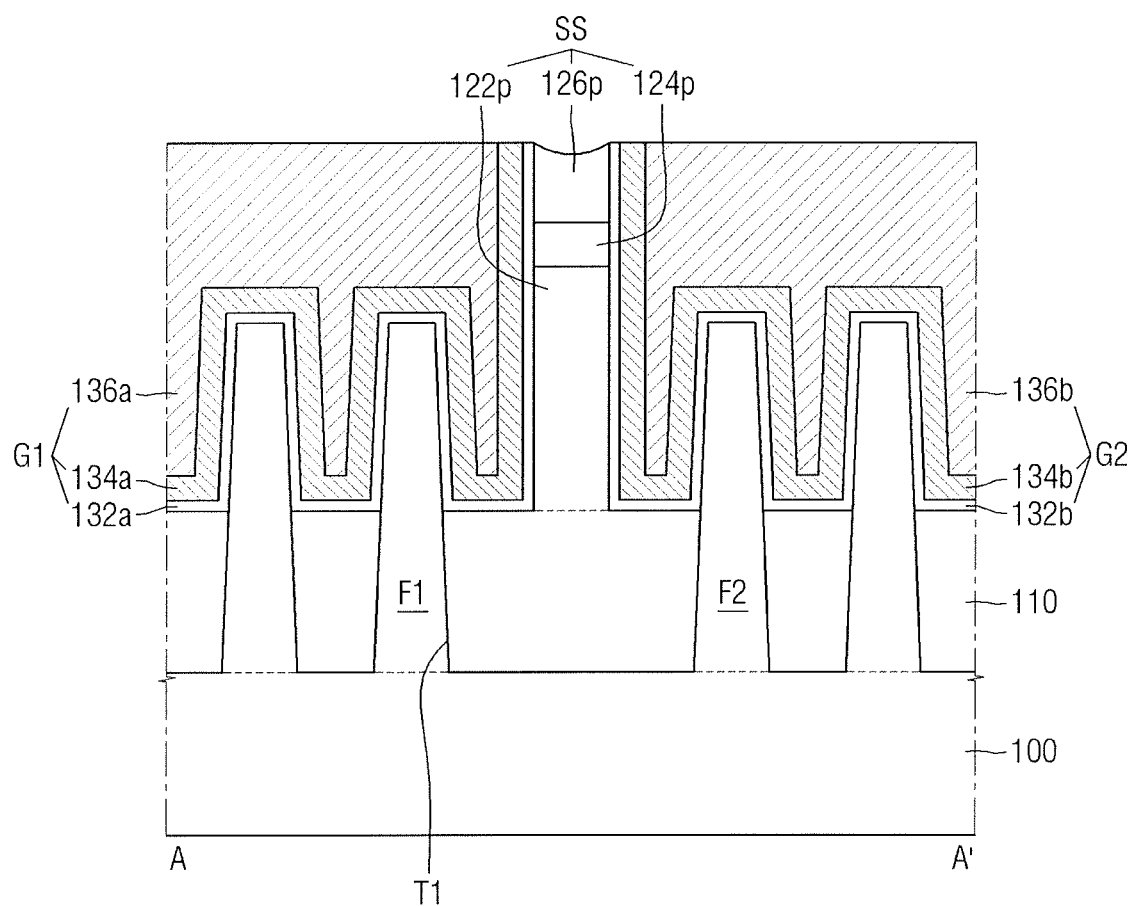

Referring to FIGS. 7B and 7C, the top surface of a separating structure SS may not be disposed on the same plane as the top surfaces of first and second gate structures G1 and G2.

In an example, as illustrated in FIG. 7B, the separating structure SS may protrude beyond the top surfaces of the first and second gate structures G1 and G2. In some example embodiments, the top surface of the separating structure SS may have a convex shape.

In another example, as illustrated in FIG. 7C, the separating structure SS may be recessed downwardly from the top surfaces of the first and second gate structures G1 and G2. In some example embodiments, the top surface of the separating structure SS may have a concave shape.

The separating structure SS may have the shape illustrated in FIG. 7B or 7C because of the characteristics of a planarization process for planarizing the first and second gate structures G1 and G2 and the separating structure SS, and this will be described below with reference to FIGS. 29 through 34. In an example, in a case where the etching rate of the separating structure SS is lower than the etching rate of the first and second gate structures G1 and G2, the separating structure SS of FIG. 7B may be formed in the planarization process. On the other hand, in a case where the etching rate of the separating structure SS is higher than the etching rate of the first and second gate structures G1 and G2, the separating structure SS of FIG. 7C may be formed in the planarization process.

Figure 8:
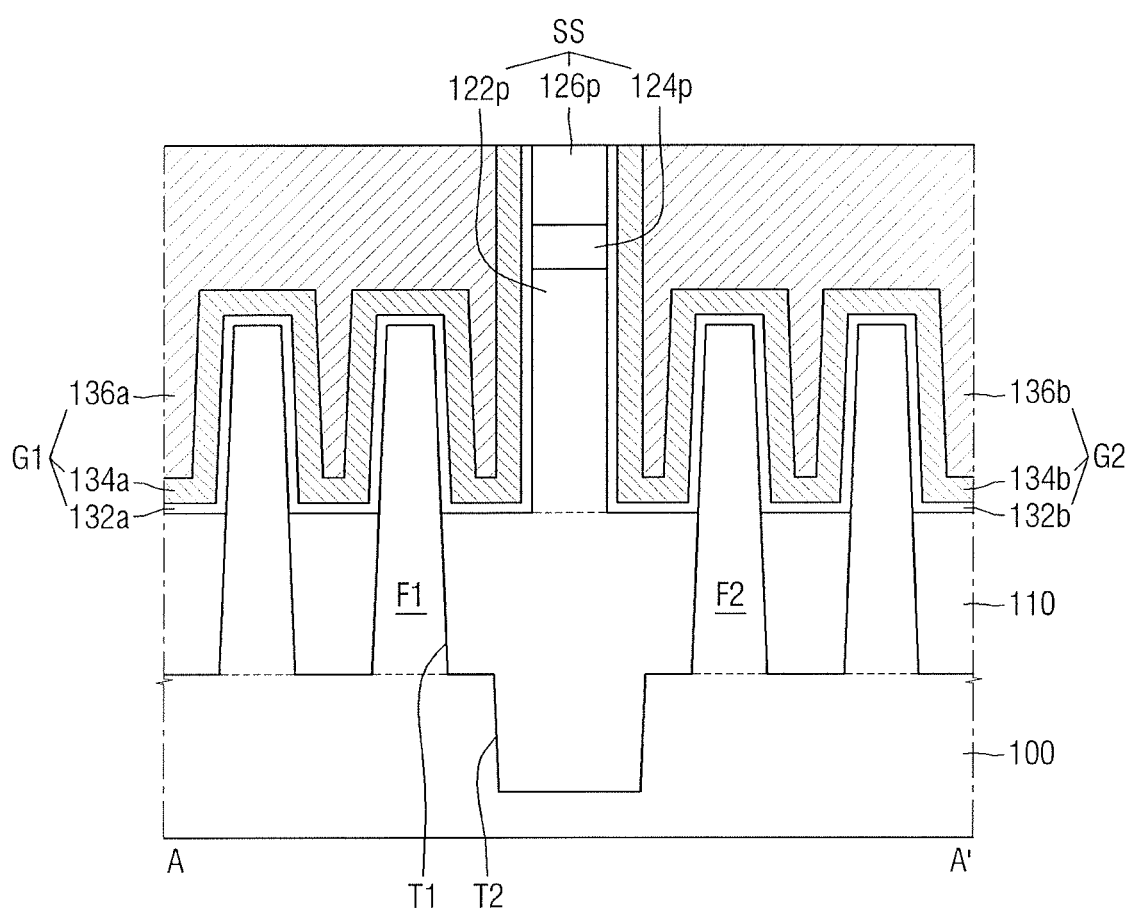

Referring to FIG. 8, a substrate 100 may further include a second trench T2.

The second trench T2 may be disposed between first and second fin patterns F1 and F2 to be adjacent to a first trench T1. The second trench T2 may be formed to be deeper than the first trench T1. In an example, the bottom surface of the second trench T2 may be lower than the bottom surface of the first trench T1.

A field insulating film 110 may fill the first and second trenches T1 and T2.

In some example embodiments, a separating structure SS may overlap with the second trench T2. As used herein, the term "overlap" means that elements overlap with each other in a vertical direction. Thus, the separating structure SS may be formed in a vertical direction with respect to the second trench T2.

Accordingly, the field insulating film 110, which fills the first and second trenches T1 and T2, may separate the first and second fin patterns F1 and F2. The separating structure SS, which is formed on the field insulating film 110, may separate first and second gate structures G1 and G2.

Figure 9:
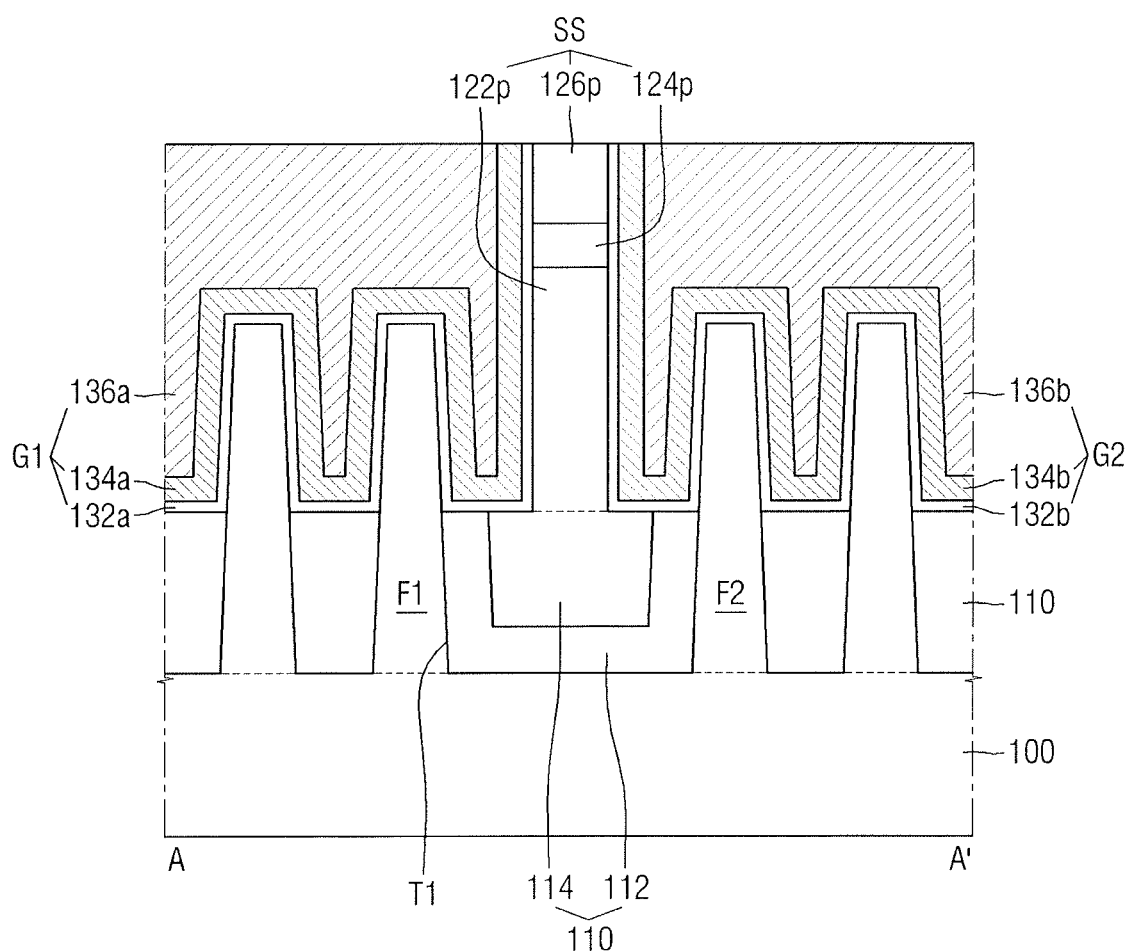

Referring to FIG. 9, a field insulating film 110 may include first and second sub-field insulating films 112 and 114. In some example embodiments, the first and second sub-field insulating films 112 and 114 may be formed between first and second fin patterns F1 and F2.

The first sub-field insulating film 112 may be formed along the sidewalls and the bottom surface of the first trench T1. Thus, the first sub-field insulating film 112 may be a part of the field insulating film 110 that is placed in contact with the sidewalls of each of the first and second fin patterns F1 and F2.

The second sub-field insulating film 114 may be formed on the first sub-field insulating film 112. The second sub-field insulating film 114 may be placed in direct contact with a separating structure SS. In an example, the second sub-field insulating film 114 may be placed in direct contact with a first insulating pattern 122p of the separating structure SS. The field insulating film 110 and the separating structure SS may be formed in one integral body with each other. Thus, the field insulating film 110 and the separating structure SS may include the same insulating material. In an example, the second sub-field insulating film 114 and the first insulating pattern 122p of the separating structure SS may include substantially the same oxide.

Figure 10:
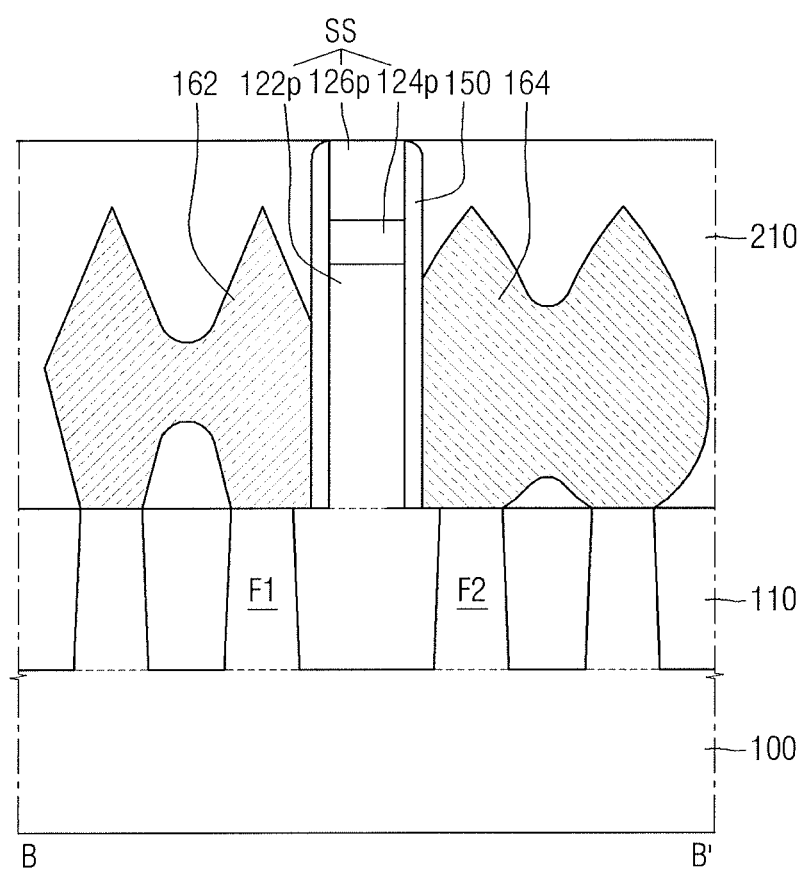
FIG. 10 illustrates a cross-sectional view of a semiconductor device according to some example embodiments.
Figure 11:
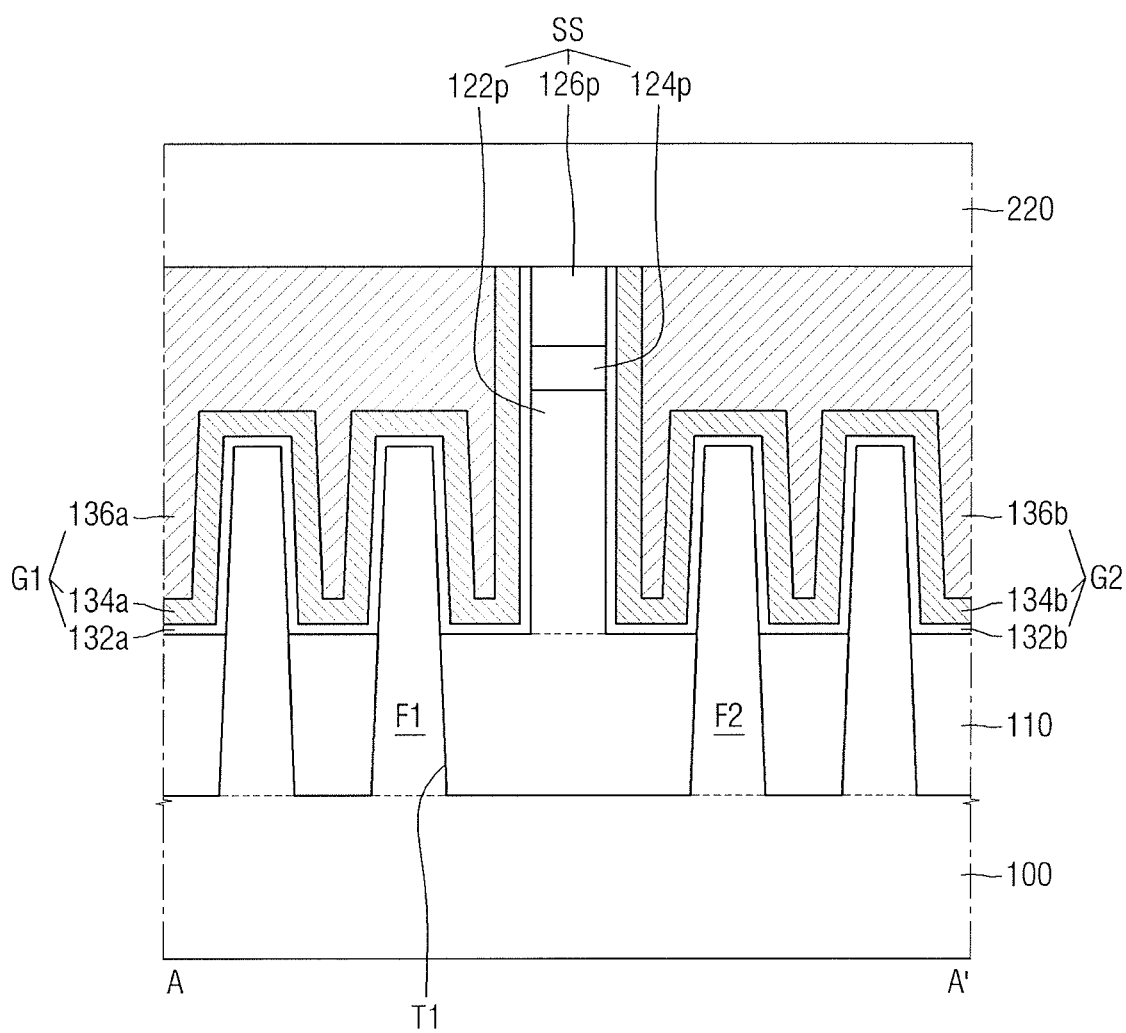
FIGS. 11 through 14 illustrate cross-sectional views of a semiconductor device according to some example embodiments.
Figure 12:
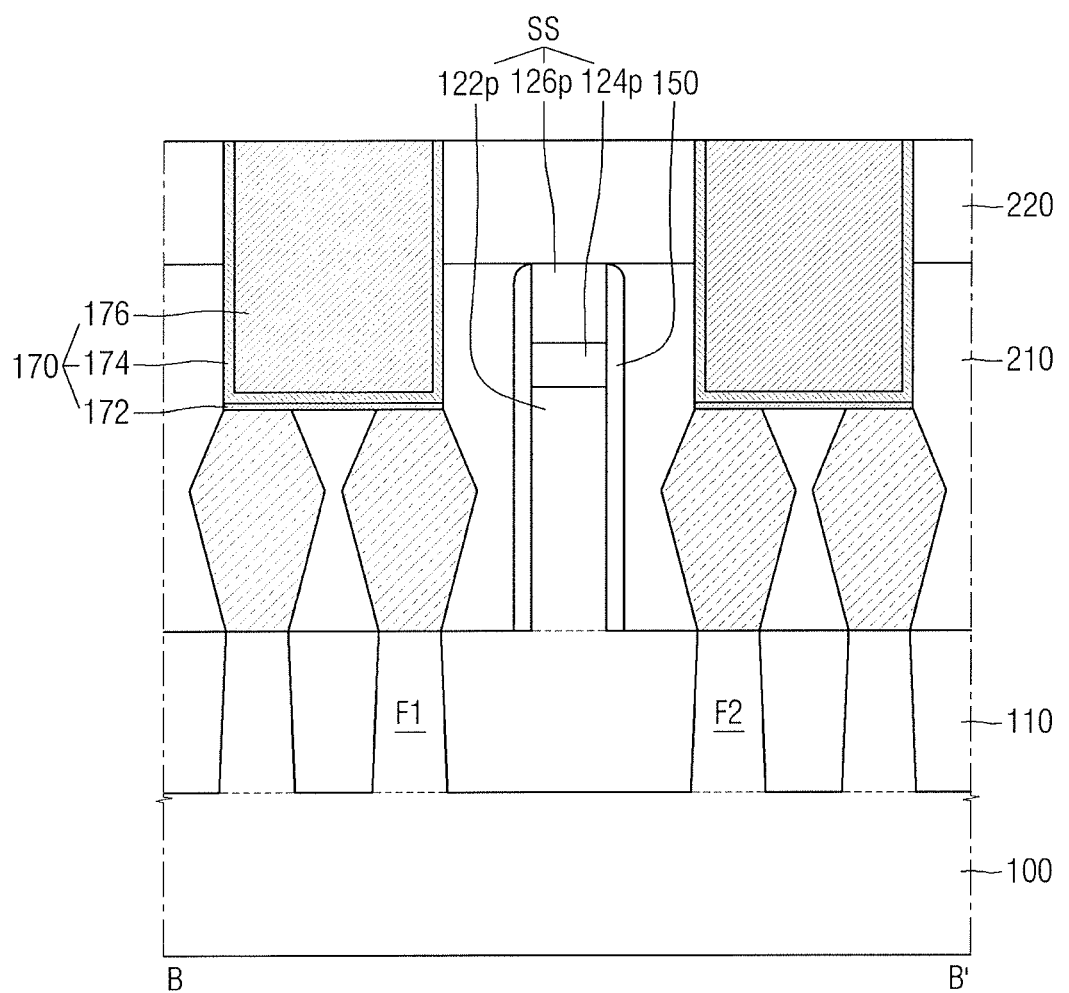
Figure 13:
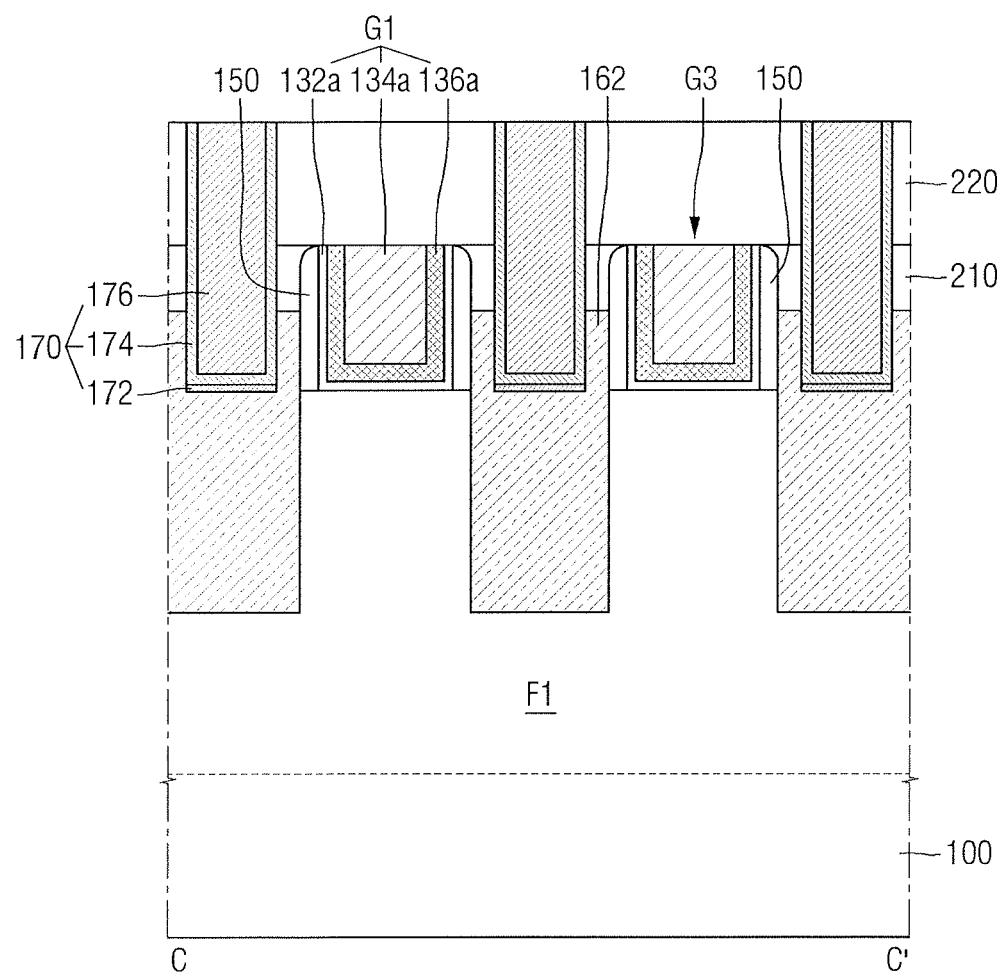
Figure 14:
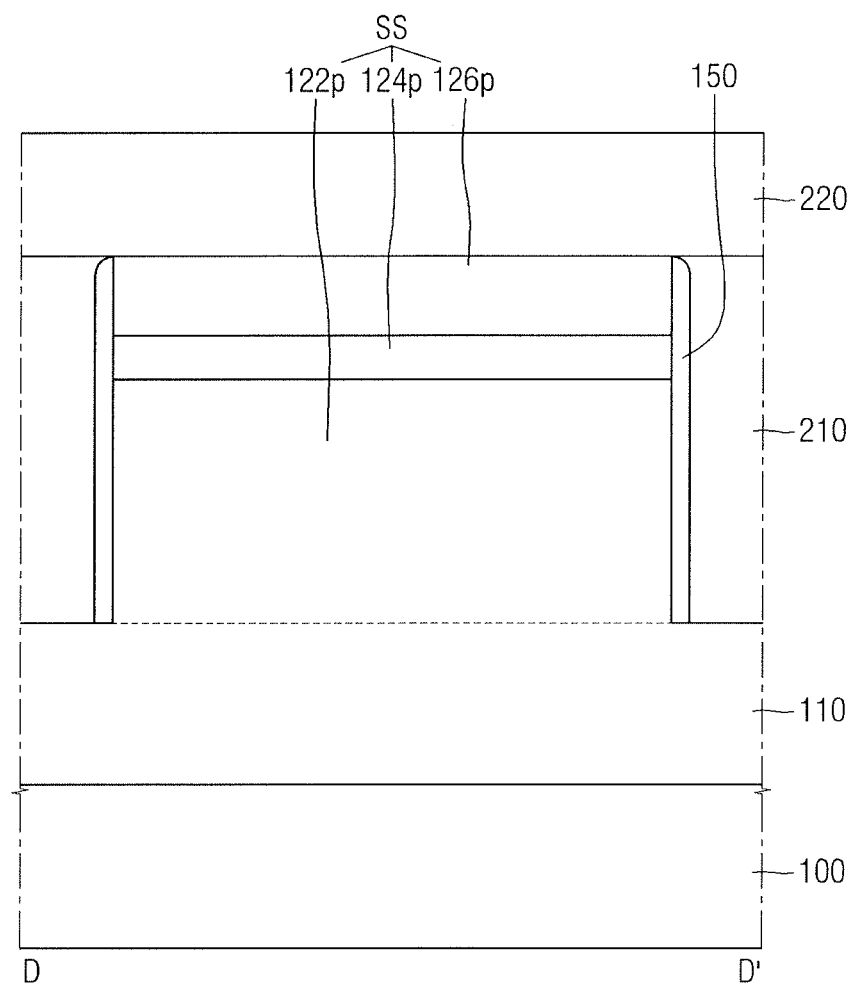

FIG. 10 is a cross-sectional view of a semiconductor device according to some example embodiments. For example, FIG. 10 is a cross-sectional view taken along line B-B' of FIG. 1. For convenience, redundant descriptions of the example embodiment of FIGS. 1 through 6 may be omitted.

Referring to FIG. 10, a separating structure SS may separate first and second epitaxial patterns 162 and 164.

In an example, at least parts of the sidewalls of the first epitaxial pattern 162 may extend along the sidewalls of the separating structure SS, and at least parts of the sidewalls of the second epitaxial pattern 164 may extend along the sidewalls of the separating structure SS.

In an example, at least parts of the sidewalls of the first or second epitaxial pattern 162 or 164 may be placed in contact with a spacer 150, which is formed on the sidewalls of the separating structure SS. Thus, parts of the sidewalls of the first epitaxial pattern 162 may be defined by the sidewalls of the spacer 150, and parts of the sidewalls of the second epitaxial pattern 164 may also be defined by the sidewalls of the spacer 150.

In some example embodiments, epitaxial patterns of different conductivity types may be formed on both sides of the separating structure SS. In an example, the first epitaxial pattern 162 may include impurities of a different conductivity type from the second epitaxial pattern 164. In an example, the first epitaxial pattern 162 may include P-type impurities, and the second epitaxial pattern 164 may include N-type impurities. In this example, the first and second epitaxial patterns 162 and 164 may have different shapes. In an example, the exterior of the first epitaxial pattern 162 may have a pentagonal shape, and the exterior of the second epitaxial pattern 164 may have a round shape.

In some example embodiments, the first epitaxial pattern 162 may be connected to an epitaxial pattern on a fin pattern that is adjacent to a first fin pattern F1, and the second epitaxial pattern 164 may be connected to an epitaxial pattern on a fin pattern that is adjacent to a second epitaxial pattern 164.

As the semiconductor device according to some example embodiments is scaled, the distance between fin patterns may decrease. The first and second epitaxial patterns 162 and 164 may be formed on the first and second fin patterns F1 and F2, respectively. Thus, the distance between the first and second epitaxial patterns 162 and 164 may decrease. However, with the separating structure SS disposed between the first and second epitaxial patterns 162 and 164, the first and second epitaxial patterns 162 and 164 may be prevented from being placed in contact with each other. In an example, the separating structure SS may efficiently prevent the first epitaxial pattern 162, which includes P-type impurities, and the second epitaxial pattern 164, which includes N-type impurities, from being placed in contact with each other.

FIGS. 11 through 14 are cross-sectional views of a semiconductor device according to some example embodiments. For convenience, redundant descriptions of the example embodiment of FIGS. 1 through 6 may be omitted.

Referring to FIGS. 11 through 14, the semiconductor device according to some example embodiments may further include a second interlayer insulating film 220 and contacts 170.

The second interlayer insulating film 220 may be deposited on a first interlayer insulating film 210. In an example, the second interlayer insulating film 220 may cover the first interlayer insulating film 210, first through fourth gate structures G1 through G4, and a separating structure SS.

The second interlayer insulating film 220 may include one or more of, for example, an oxide film, a nitride film, and an oxynitride film.

The contacts 170 may be formed to be placed in contact with a first or second epitaxial pattern 162 or 164. In an example, the contacts 170 may penetrate partS of the first and second interlayer insulating films 210 and 220 and may be placed in contact with the first or second epitaxial pattern 162 or 164.

In some example embodiments, each of the contacts 170 may include a silicide film 172, a first conductive film 174, and a second conductive film 176.

The silicide film 172 may be formed at the bottoms of the contacts 170 and may be placed in contact with the first or second epitaxial pattern 162 or 164. The silicide film 172 may include, for example, platinum (Pt), nickel (Ni), or cobalt (Co).

The first conductive film 174 may be formed along the top surface of the silicide film 172, the sidewalls of the first interlayer insulating film 210, and the sidewalls of the second interlayer insulating film 220. The second conductive film 176 may be formed to fill a space formed by the first conductive film 174.

The contacts 170 are illustrated as partially penetrating the first or second epitaxial pattern 162 or 164, as an example. In an example, the bottom surfaces of the contacts 170 may extend along the top surface of the first or second epitaxial pattern 162 or 164.

In an example, the first conductive film 174 may include, for example, titanium (Ti) or titanium nitride (TiN), and the second conductive film 176 may include, for example, W, Al, or copper (Cu).

Figure 15:
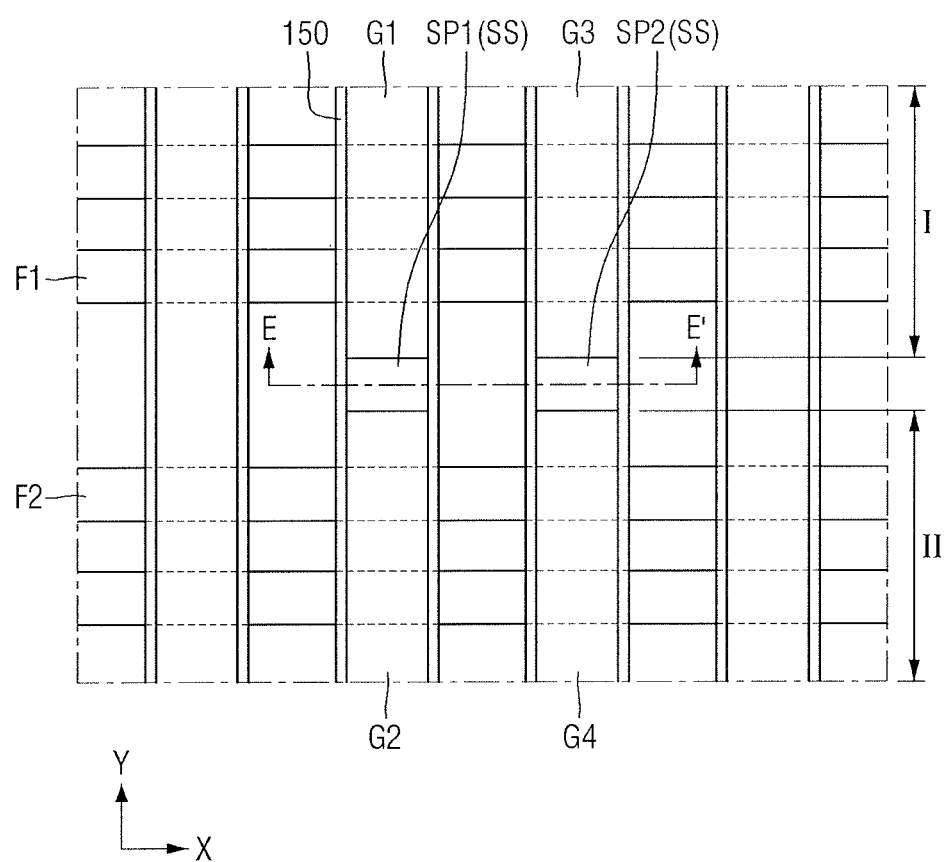
FIG. 15 illustrates a layout view of a semiconductor device according to some example embodiments.
Figure 16A:
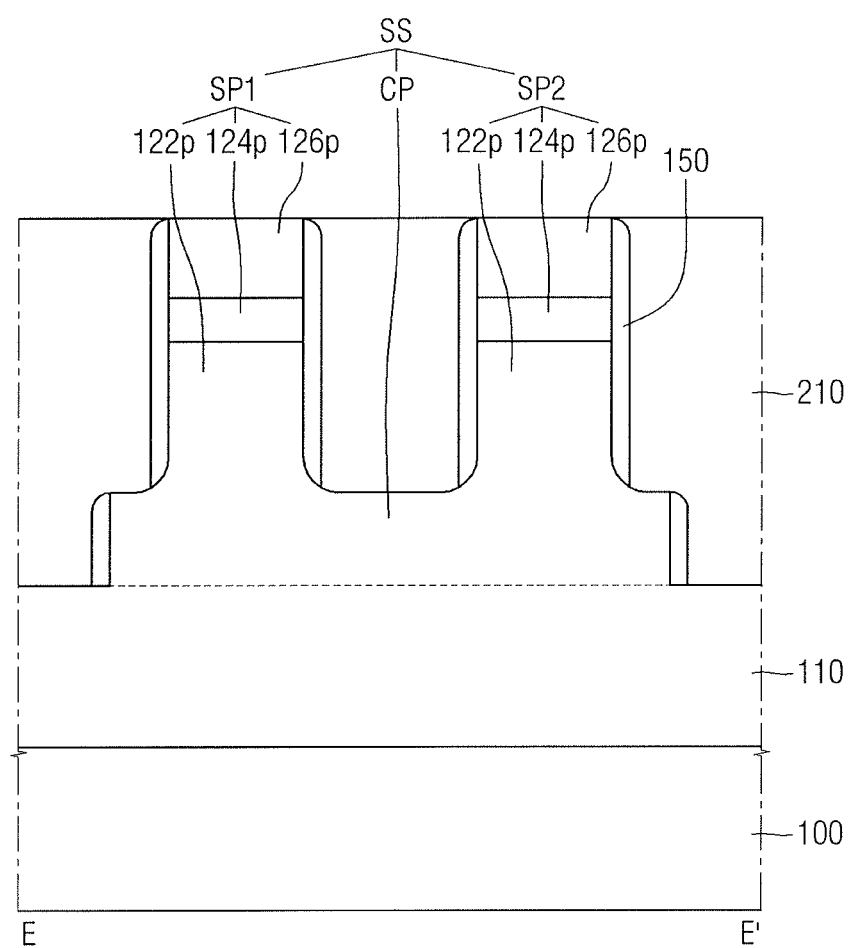
FIGS. 16A and 16B illustrate cross-sectional views taken along line E-E' of FIG. 15.
Figure 16B:
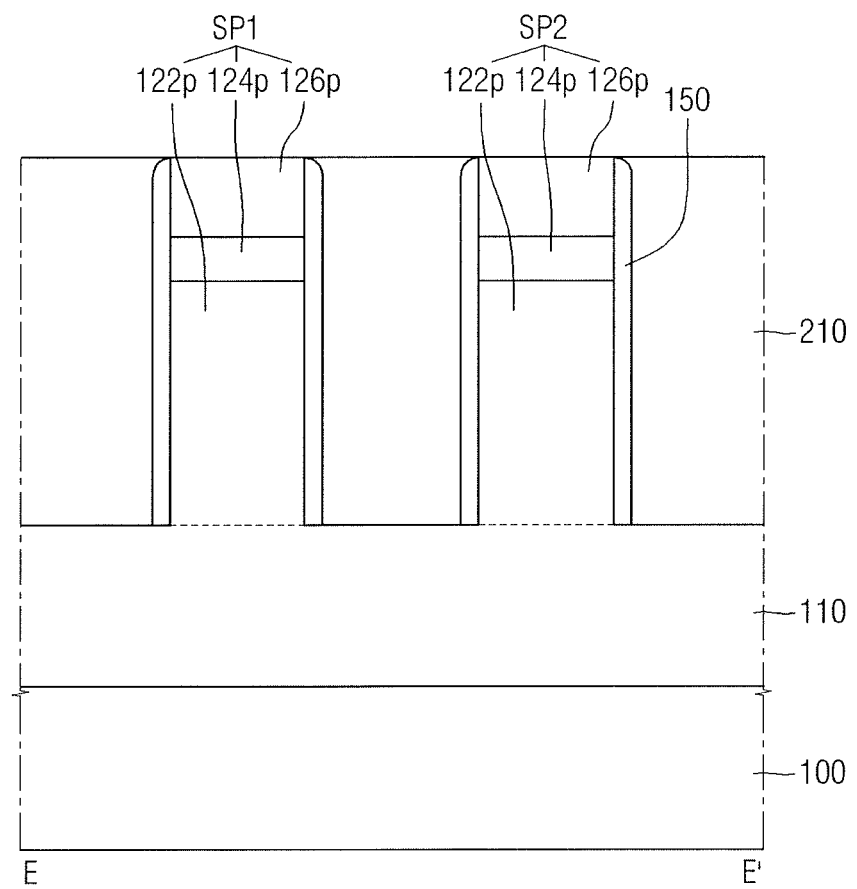

FIG. 15 is a layout view of a semiconductor device according to some example embodiments. FIGS. 16A and 16B are cross-sectional views taken along line E-E' of FIG. 15. For convenience, redundant descriptions of the example embodiment of FIGS. 1 through 6 may be omitted.

Referring to FIGS. 15 and 16A, the top surface of a separating structure SS may be uneven.

For example, the separating structure SS may include a first separating portion SP1, a second separating portion SP2, and a connecting portion CP.

The first separating portion SP1 may be a part of the separating structure SS that separates first and second gate structures G1 and G2. The second separating portion SP2 may be a part of the separating structure SS that separates third and fourth gate structures G3 and G4. The connecting portion CP may be a part of the separating structure SS that connects the first and second separating portions SP1 and SP2 over a field insulating film 110.

In some example embodiments, the top surface of the connecting portion CP may be lower than the top surfaces of the first and second separating portions SP1 and SP2. Accordingly, the top surface of the separating structure SS may be uneven. In some example embodiments, the top surface of the connecting portion CP may have a concave shape.

In some example embodiments, the first and second separating portions SP1 and SP2 may be formed on the same level as first through fourth gate structures G1 through G4. For example, the first and second separating portions SP1 and SP2 may be formed together with the first through fourth gate structures G1 through G4 during patterning for forming the first through fourth gate structures G1 through G4. Accordingly, in some example embodiments, the sidewalls of the first separating portion SP1 may be disposed substantially on the same plane as the sidewalls of the first gate structure G1 and the sidewalls of the second gate structure G2. Similarly, the sidewalls of the second separating portion SP2 may be disposed substantially on the same plane as the sidewalls of the third gate structure G3 and the sidewalls of the fourth gate structure G4.

A spacer 150 may extend along the sidewalls of the separating structure SS. For example, the spacer 150 may extend along both sidewalls of the first separating portion SP1. The spacer 150 may extend along both sidewalls of the second separating portion SP2. Accordingly, the spacer 150 may extend along the sidewalls of each of the first through fourth gate structures G1 through G4 and the sidewalls of the separating structure SS.

Referring to FIGS. 15 and 16B, the first and second separating portions SP1 and SP2 may not be placed in contact with each other.

For example, in the example embodiment of FIG. 16B, unlike in the example embodiment of FIG. 16A, the separating structure SS may not include the connecting portion CP. Accordingly, the spacer 150 may be placed in contact with the top surface of the field insulating film 110 on both sidewalls of the first separating portion SP1 and on both sidewalls of the second separating portion SP2.

A method of fabricating a semiconductor device according to some example embodiments will hereinafter be described with reference to FIGS. 1 through 6 and 17 through 43B.

FIGS. 17 through 43B illustrate stages in a method of fabricating a semiconductor device according to some example embodiments. For convenience, redundant descriptions of the example embodiments of FIGS. 1 through 16B may be omitted.

Figure 17:
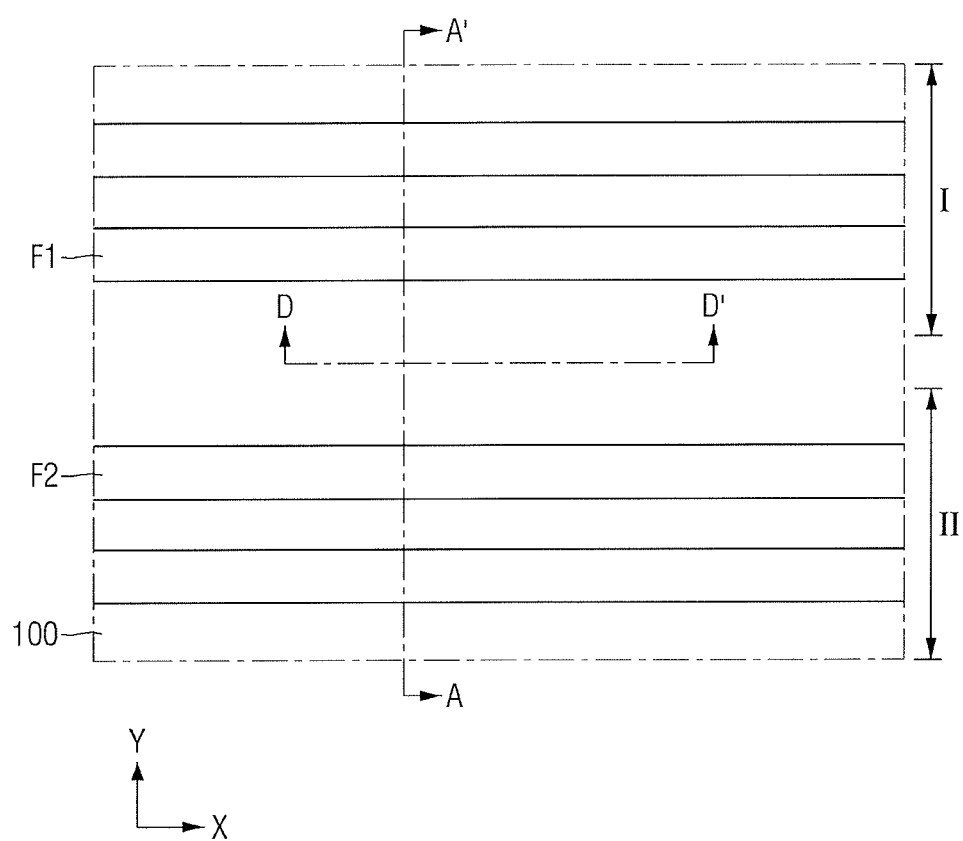
FIGS. 17 through 43B illustrate stages in a method of fabricating a semiconductor device according to some example embodiments.
Figure 18:
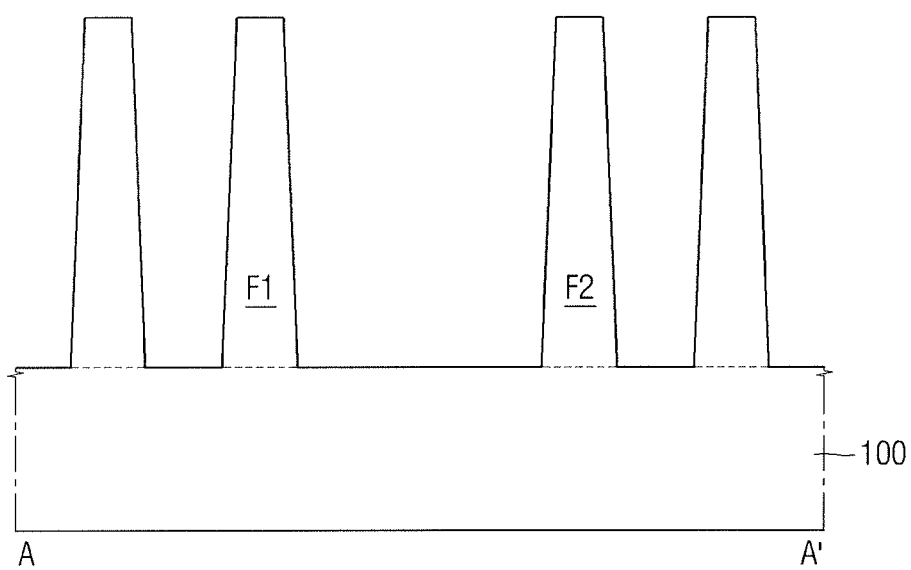
Figure 19:
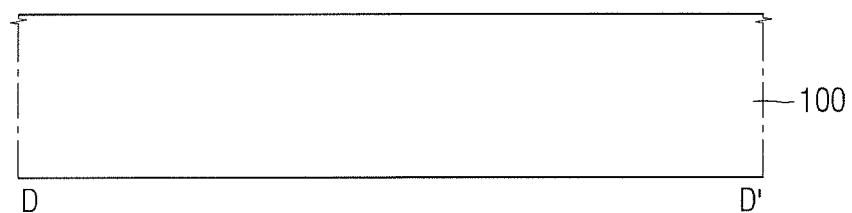

Referring to FIGS. 17 through 19, first and second fin patterns F1 and F2 are formed on a substrate 100.

In an example, the first and second fin patterns F1 and F2, which extend apart from each other, may be formed by performing an etching process on the substrate 100.

The first fin pattern F1 may be formed in a first region I of the substrate 100, and the second fin pattern F2 may be formed in a second region II of the substrate 100. The first and second fin patterns F1 and F2 may extend in a first direction X.

Figure 20:
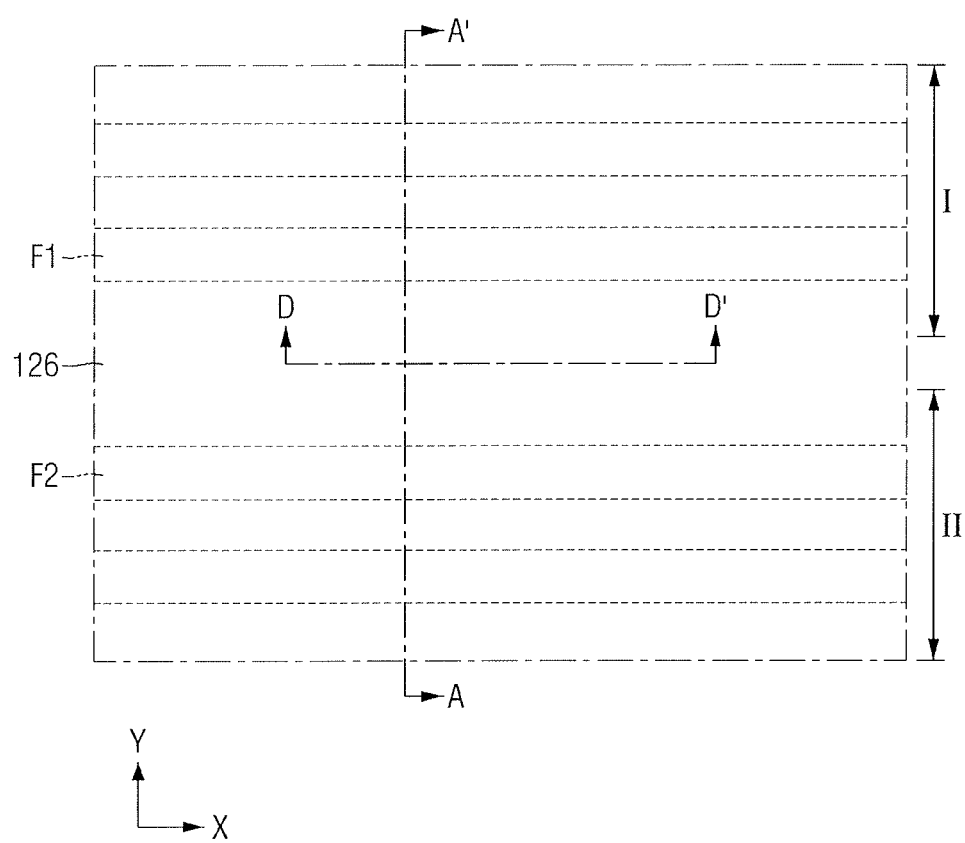
Figure 21:
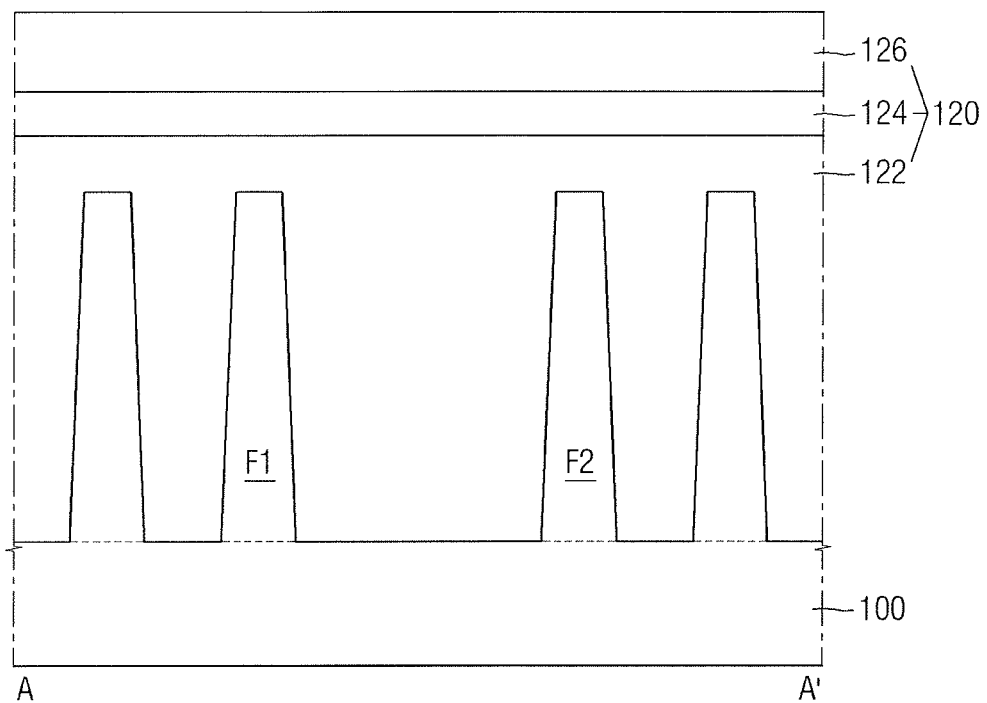
Figure 22:
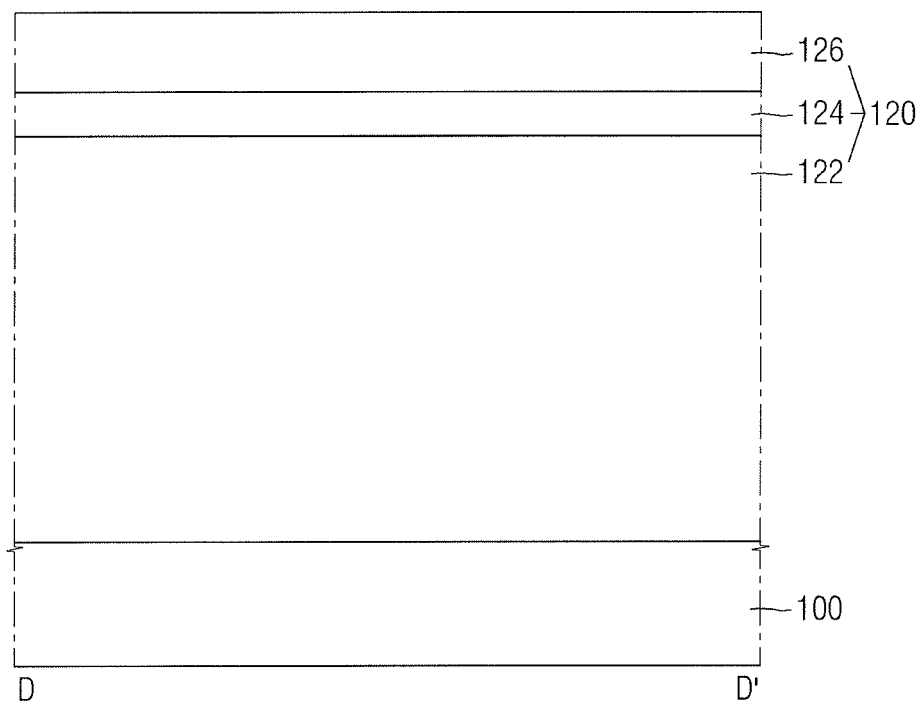

Referring to FIGS. 20 through 22, an isolation insulating film 120 is formed on the substrate 100.

The isolation insulating film 120 may be formed to cover the first and second fin patterns F1 and F2. Thus, the isolation insulating film 120 may be formed on the substrate 100 to have a top surface higher than the top surfaces of the first and second fin patterns F1 and F2.

In some example embodiments, the isolation insulating film 120 may include first, second, and third insulating films 122, 124, and 126, which are sequentially stacked on the substrate 100. Also, in some example embodiments, the second insulating film 124 may be formed to be higher than the first and second fin patterns F1 and F2. For example, the top surface of the second insulating film 124 may be formed to be higher than the top surfaces of the first and second fin patterns F1 and F2.

In some example embodiments, the first and third insulating films 122 and 126 may include an oxide, and the second insulating film 124 may include a nitride.

In some example embodiments, the isolation insulating film 120 may be a single-layer film. In an example, the isolation insulating film 120 may be a single-layer film including an oxide.

Figure 23:
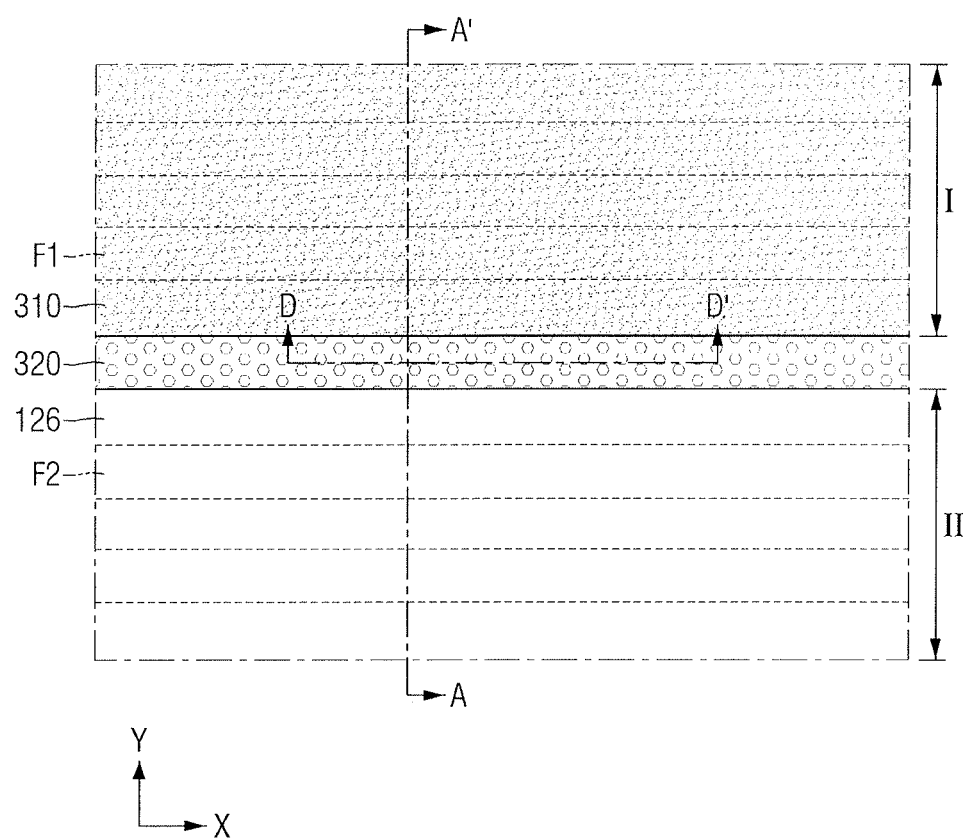
Figure 24:
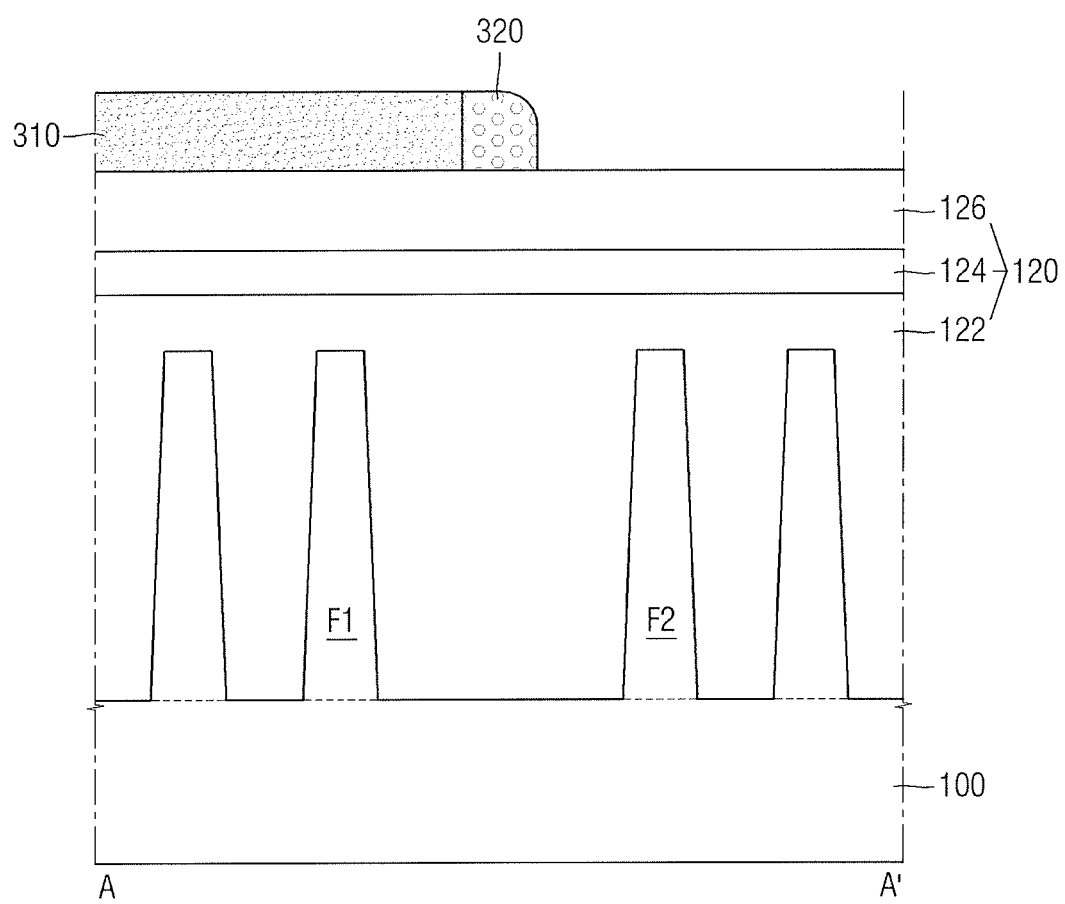
Figure 25:
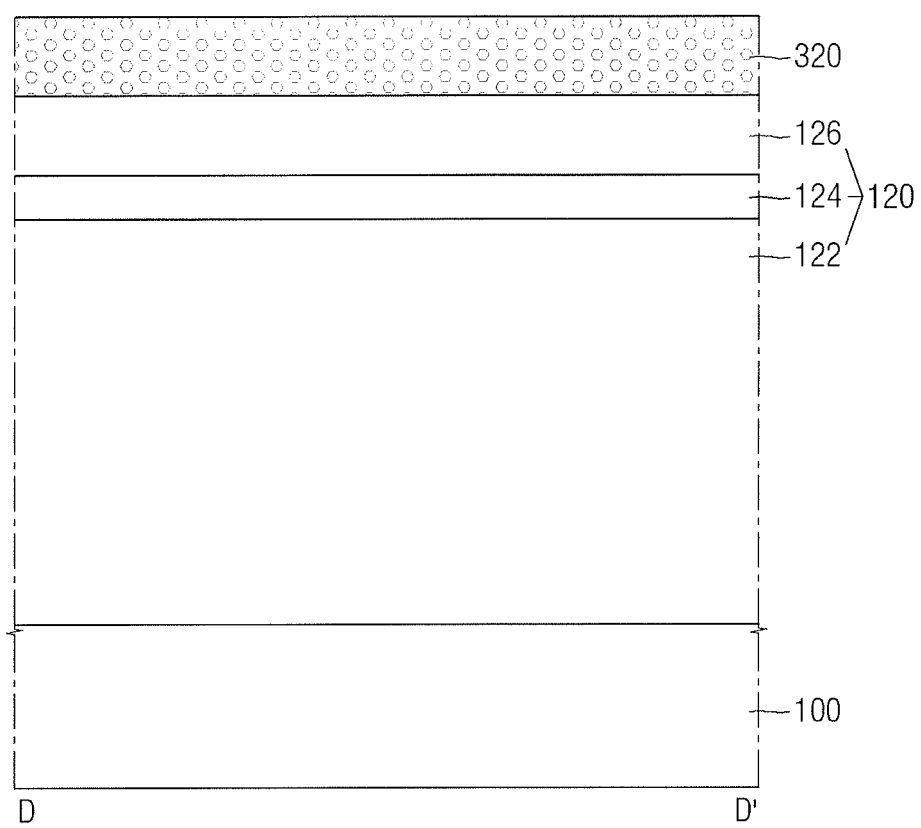

Referring to FIGS. 23 through 25, a sacrificial pattern 310 and a first mask pattern 320 are formed on the isolation insulating film 120.

The sacrificial pattern 310 may be formed to partially expose the top surface of the isolation insulating film 120. For example, the sacrificial pattern 310 may cover a part of the isolation insulating film 120 in the first region I and may expose a part of the isolation insulating film 120 in the second region II. For example, a sidewall of the sacrificial pattern 310 may be formed along an edge of the first region I that is adjacent to the second region II.

The sacrificial pattern 310 may include, for example, a spin-on-hardmask (SOH).

Thereafter, the first mask pattern 320, which extends along the sidewall of the sacrificial pattern 310, may be formed. For example, a mask film may be formed to extend along the profiles of the sacrificial pattern 310 and the isolation insulating film 120. Thereafter, the first mask pattern 320, which extends along the sidewall of the sacrificial pattern 310, may be formed by performing an etch-back process on the mask film.

The sidewall of the sacrificial pattern 310 may be formed along the edge of the first region I that is adjacent to the second region II. Thus, the first mask pattern 320 may be formed between the first and second regions I and II. For example, the first mask pattern 320 may be formed on the isolation insulating film 120 between the first and second fin patterns F1 and F2. The first mask pattern 320 may extend longitudinally in the first direction X.

Figure 26:
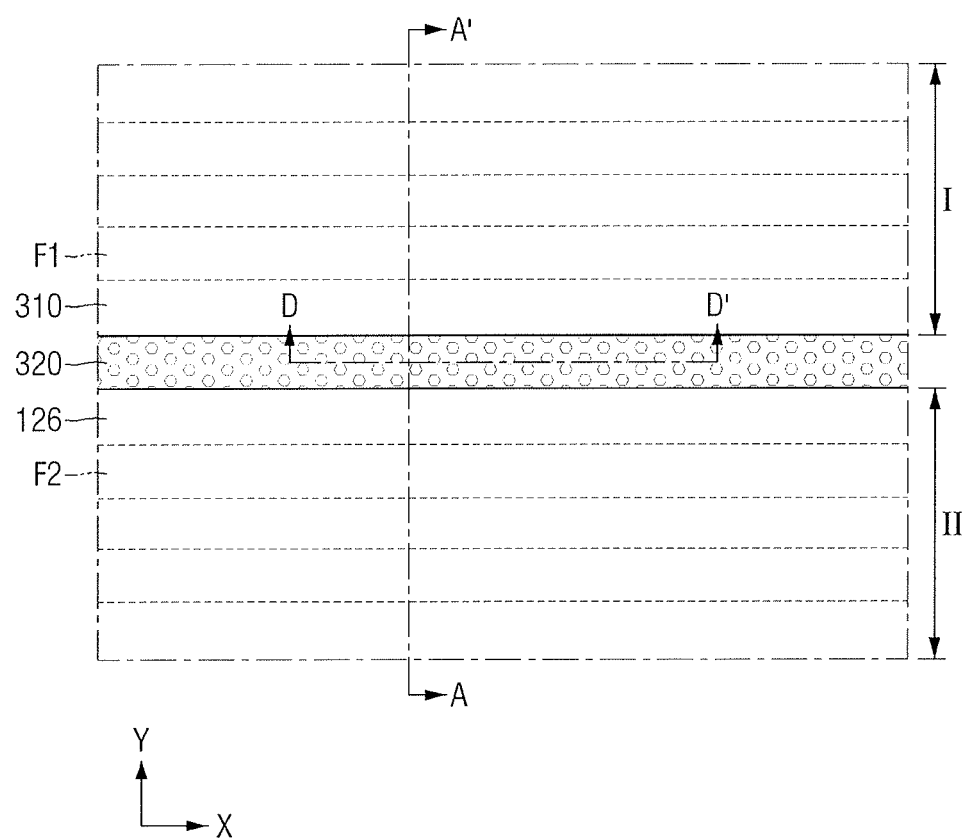
Figure 27:
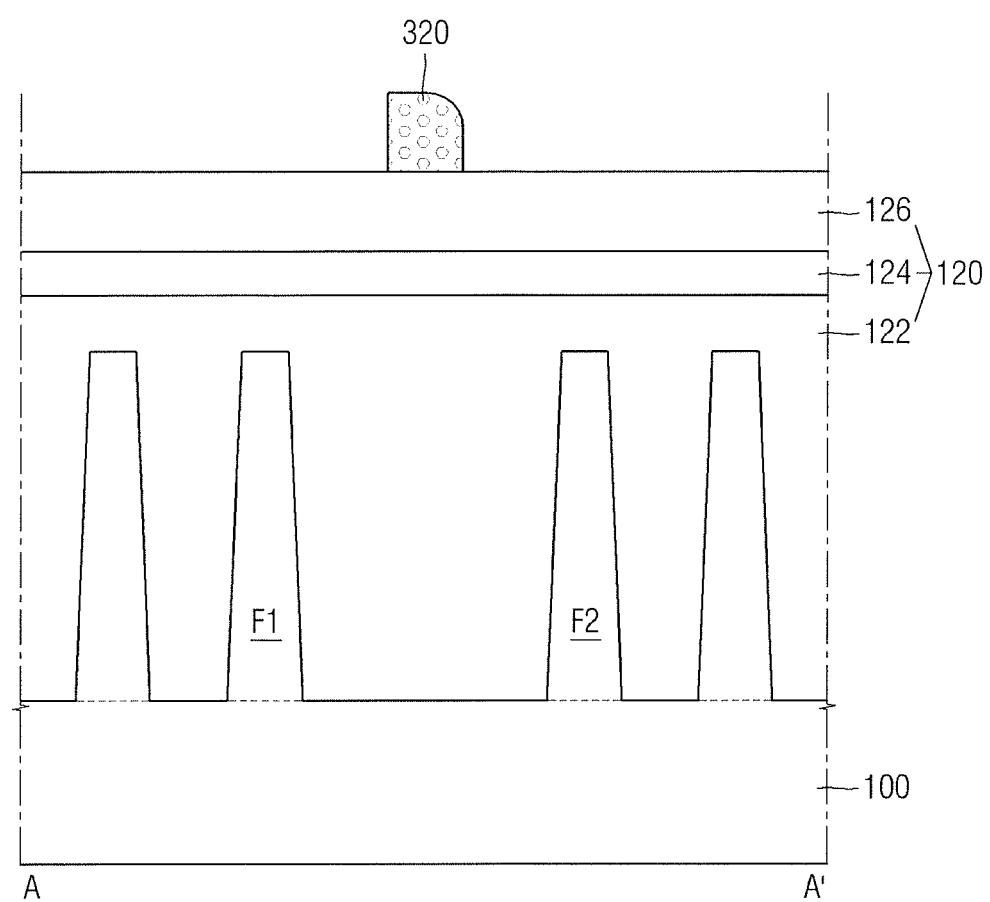
Figure 28:
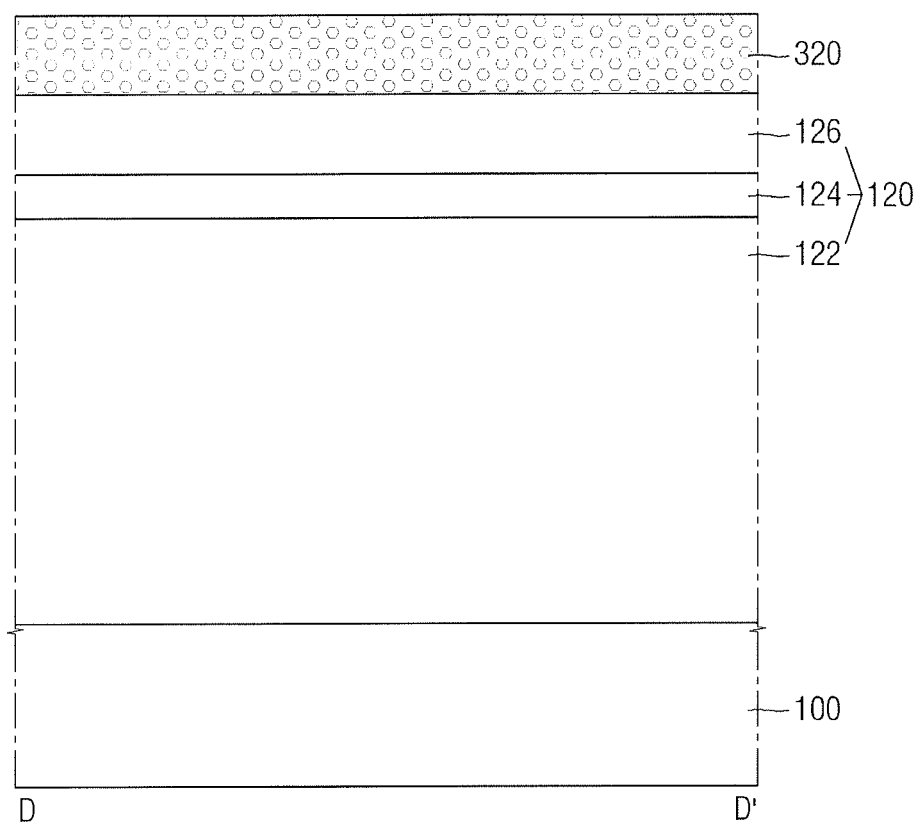

Referring to FIGS. 26 through 28, the sacrificial pattern 310 is removed.

Accordingly, the first mask pattern 320 may expose parts of the isolation insulating film 120 in the first and second regions I and II.

Figure 29:
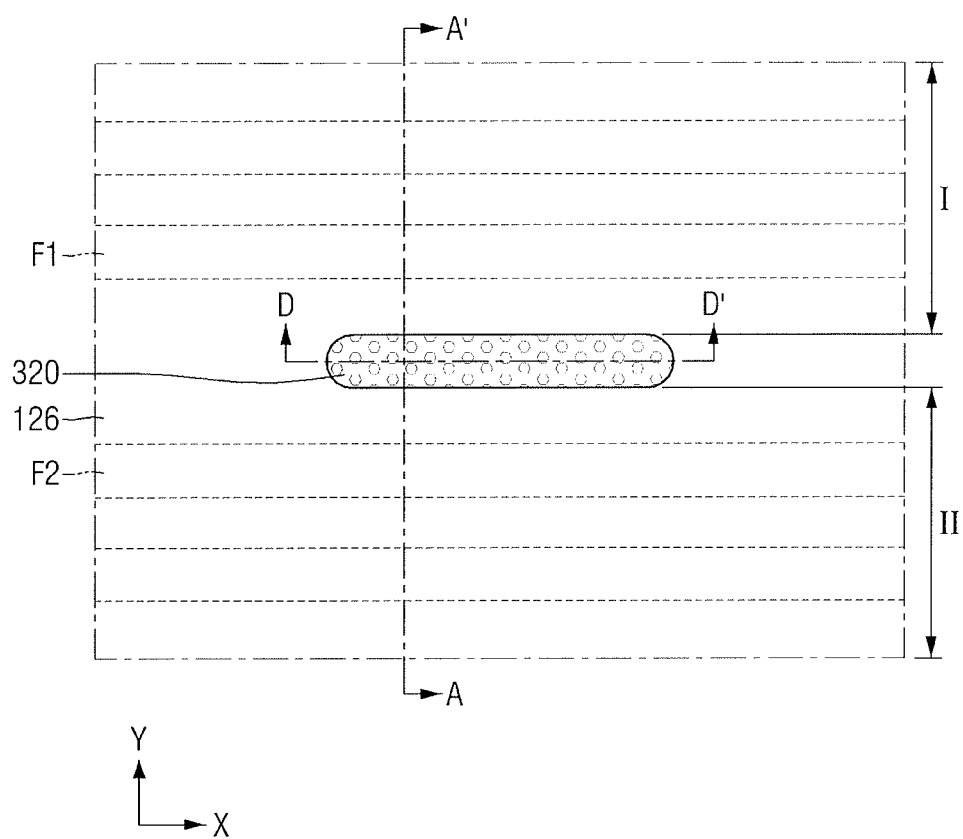
Figure 30:
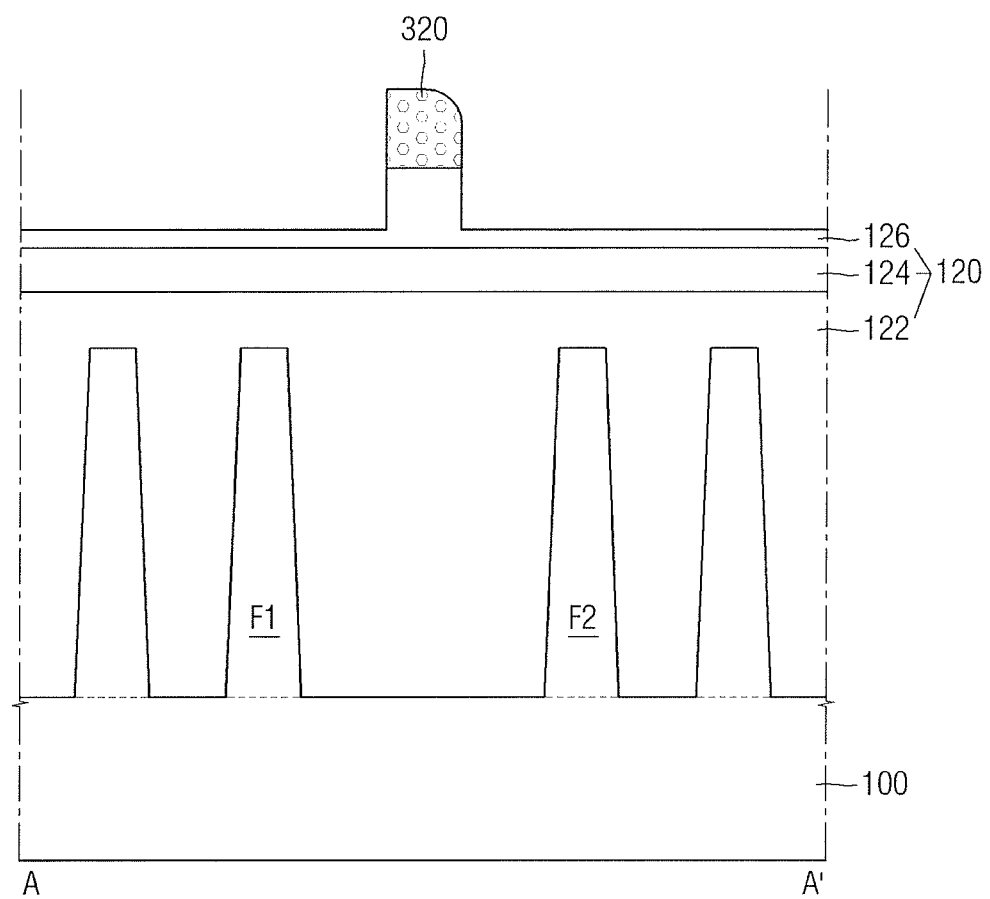
Figure 31:
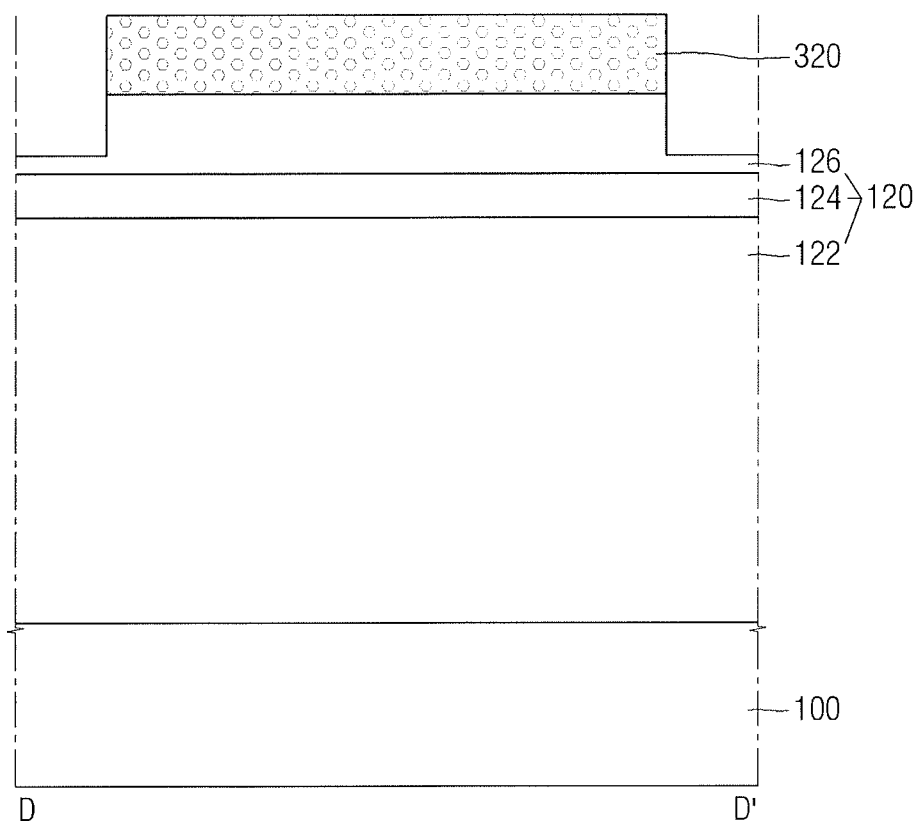

Referring to FIGS. 29 through 31, the first mask pattern 320 may be patterned.

For example, a part of the first mask pattern 320 that extends in the first direction X may be removed. Accordingly, as illustrated in FIG. 29, the first mask pattern 320 may be formed to have an elliptical top surface, as an example. In another implementation, the first mask pattern 320 may be formed to have a rectangular top surface depending on the characteristics of patterning that the first mask pattern 320 is subjected to.

In some example embodiments, during the patterning of the first mask pattern 320, a part of the isolation insulating film 120 may also be patterned. For example, during the patterning of the first mask pattern 320, at least a part of the third insulating film 126 may also be patterned. In another implementation, the isolation insulating film 120 may not be patterned during the patterning of the first mask pattern 320.

In some example embodiments, during the patterning of the first mask pattern 320, the second insulating film 124 may be used as an etch stop layer. Accordingly, a part of the top surface of the second insulating film 124 may be exposed in the process of patterning the first mask pattern 320. The first insulating film 122 may be protected by the second insulating film 124. Thus, the first and second fin patterns F1 and F2 may not be exposed.

Figure 32:
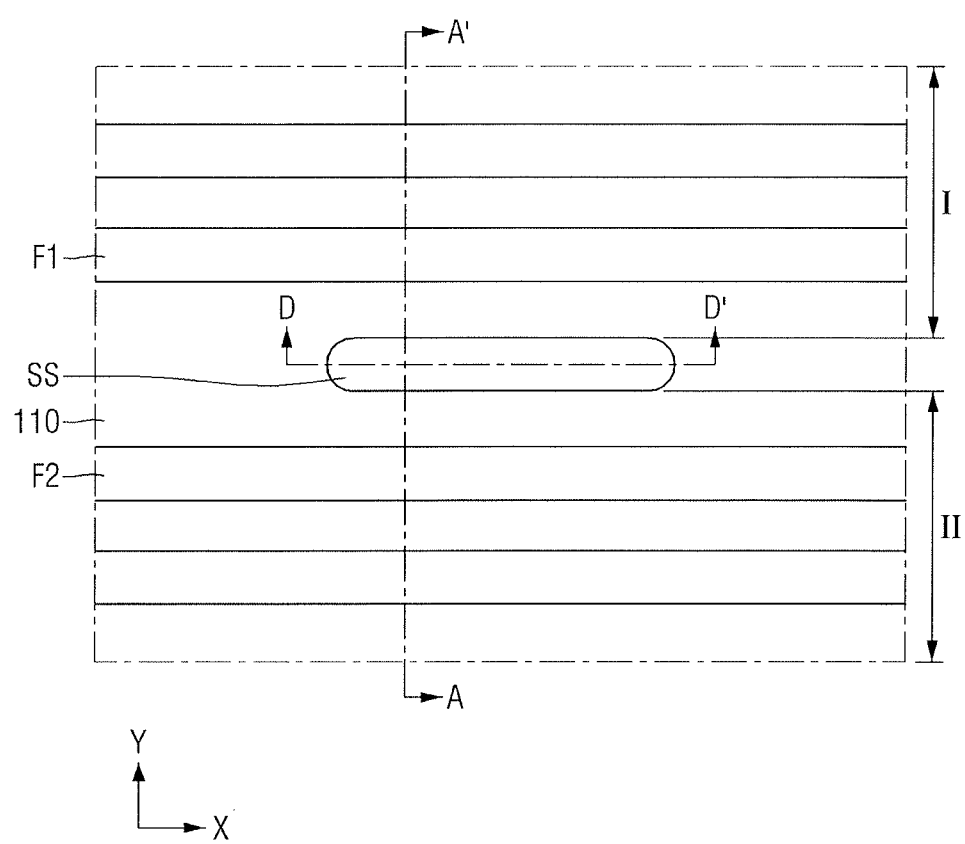
Figure 33:
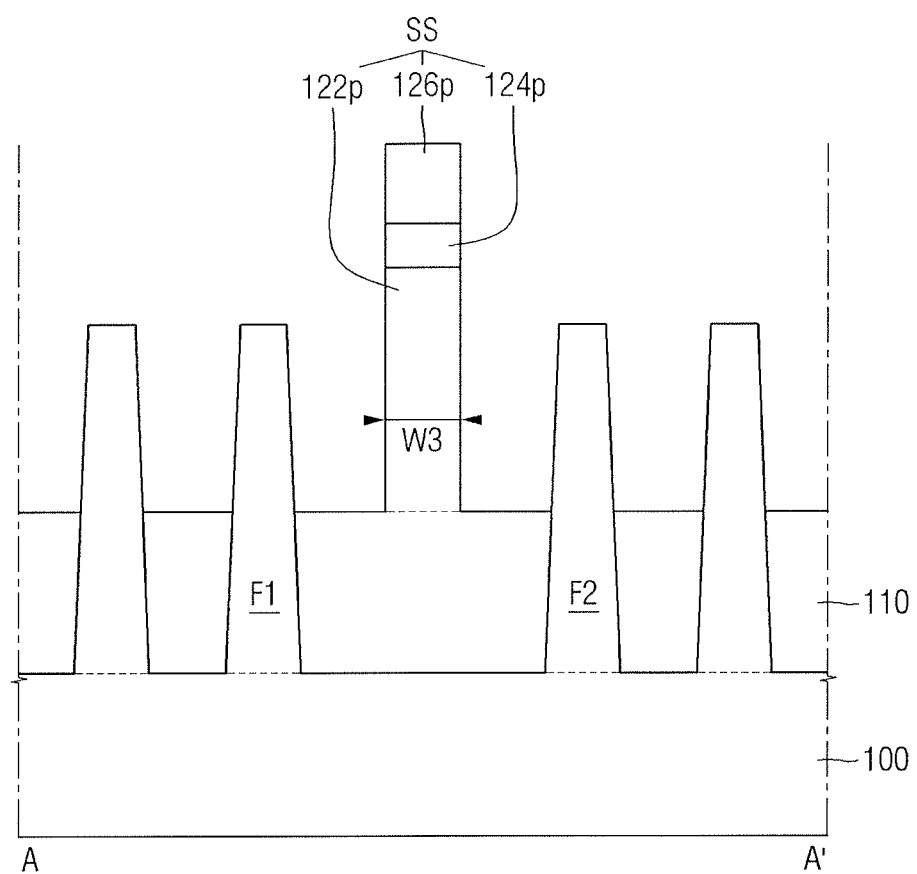
Figure 34:
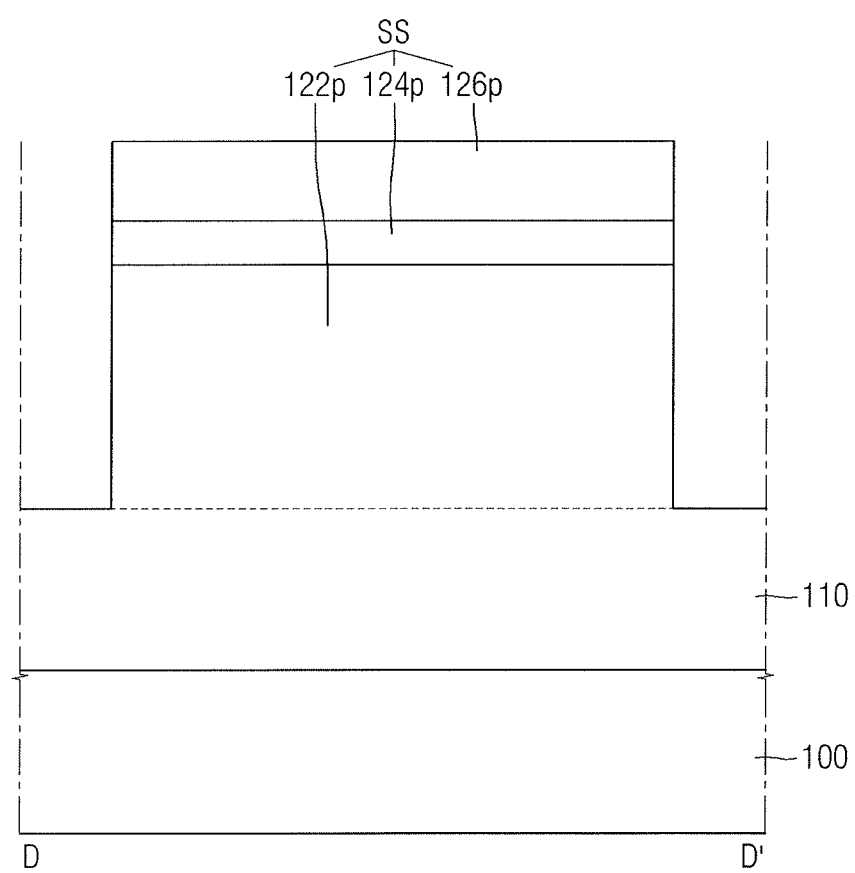

Referring to FIGS. 32 through 34, upper portions of the first and second fin patterns F1 and F2 may be exposed by performing a first etching process using the first mask pattern 320 as an etching mask. Thereafter, the first mask pattern 320 is removed.

Accordingly, a field insulating film 110, which surrounds parts of the first and second fin patterns F1 and F2, and a separating structure SS, which is disposed on the field insulating film 110, may be formed.

FIG. 33 illustrates that a third width W3 of the separating structure SS is substantially uniform regardless of the distance from the top surface of the field insulating film 110, as an example. In another implementation, the third width W3 of the separating structure SS may vary in accordance with the distance from the top surface of the field insulating film 110. For example, as illustrated in FIG. 33, the third width W3 of the separating structure SS may gradually decrease away from the top surface of the field insulating film 110.

Figure 35:
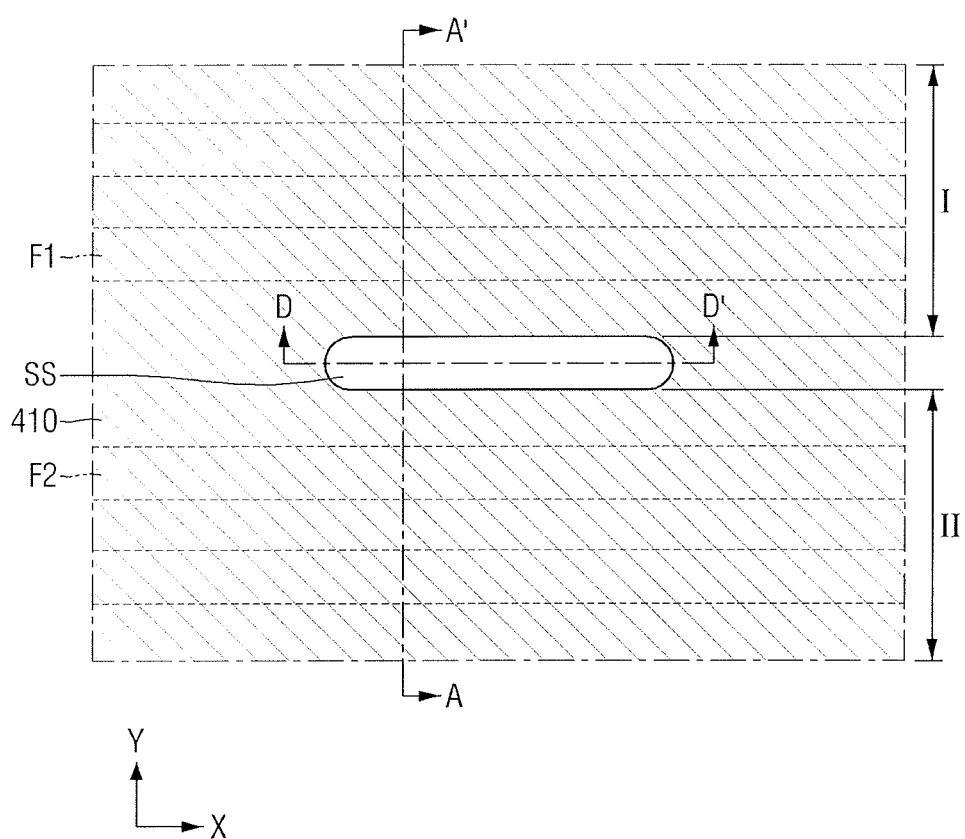
Figure 36:
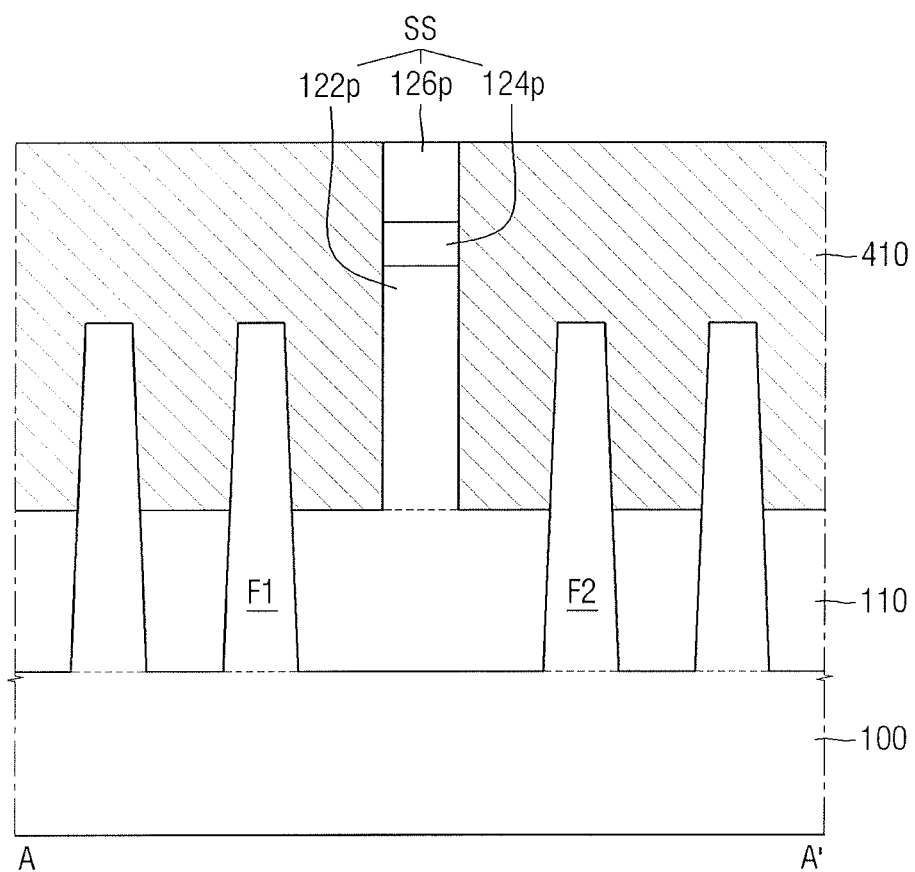
Figure 37:
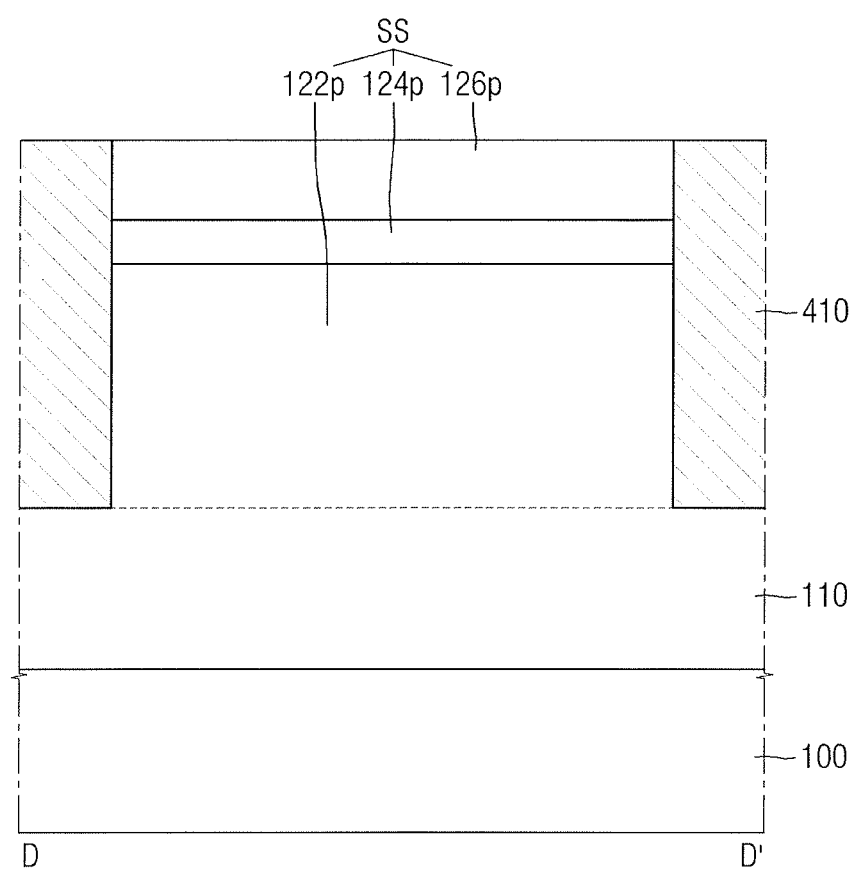

Referring to FIGS. 35 through 37, a dummy gate film 410, which covers the first and second fin patterns F1 and F2 and the field insulating film 110, is formed.

For example, the dummy gate film 410 may be formed on the structure illustrated in FIGS. 32 through 34. Accordingly, the dummy gate film 410, which covers the first and second fin patterns F1 and F2, the field insulating film 110, and the separating structure SS, may be formed.

The dummy gate film 410 may include, for example, polysilicon. In another implementation, the dummy gate film 410 may include, for example, a silicon oxide film and polysilicon formed on the silicon oxide film.

Thereafter, a planarization process may be performed until the top surface of the separating structure SS is exposed. The planarization process may include, for example, a CMP process.

Referring to FIGS. 38 through 40A, the dummy gate film 410 is patterned.

For example, second mask patterns 420 may be formed on the structure illustrated in FIGS. 35 through 37.

The second mask patterns 420 may be formed to intersect the first and second fin patterns F1 and F2. In an example, a plurality of second mask patterns 420, which extend in a second direction Y, may be formed. At least parts of the second mask patterns 420 may be formed to intersect the separating structure SS.

Thereafter, a second etching process may be performed using the second mask patterns 420 as an etching mask. Accordingly, a first dummy gate structure DG1 may be formed on an exposed part of the first fin pattern F1, and a second dummy gate structure DG2 may be formed on an exposed part of the second fin pattern F2. The first and second dummy gate structures DG1 and DG2 may be separated by the separating structure SS.

Figure 38:
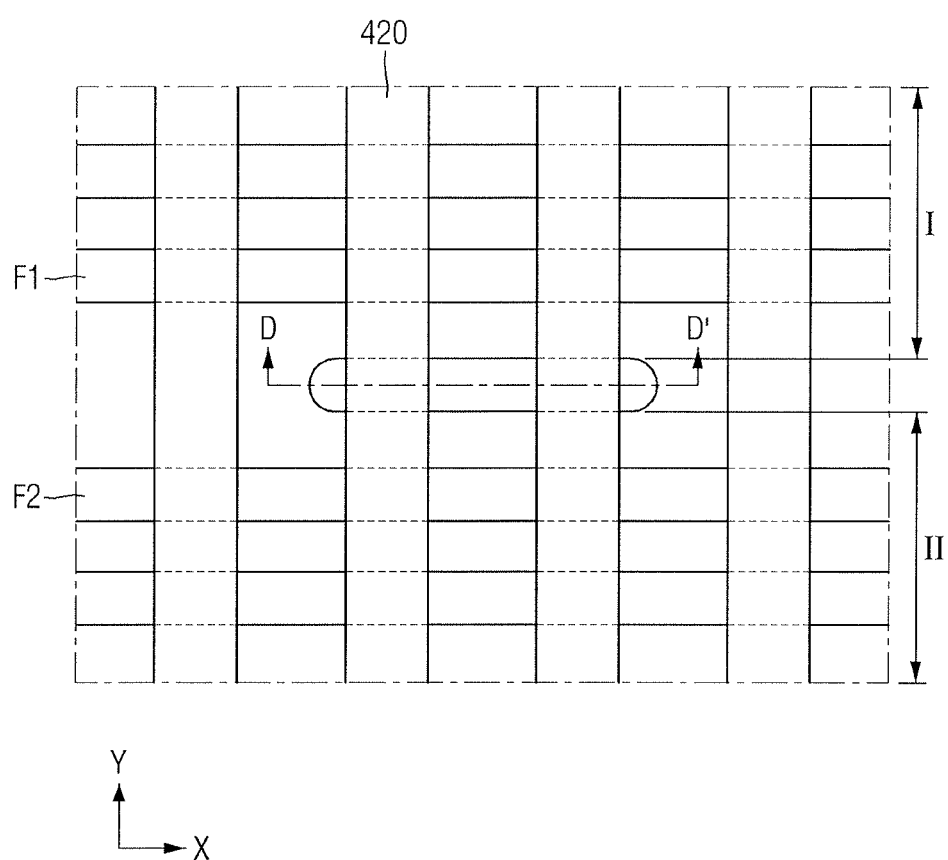
Figure 39:
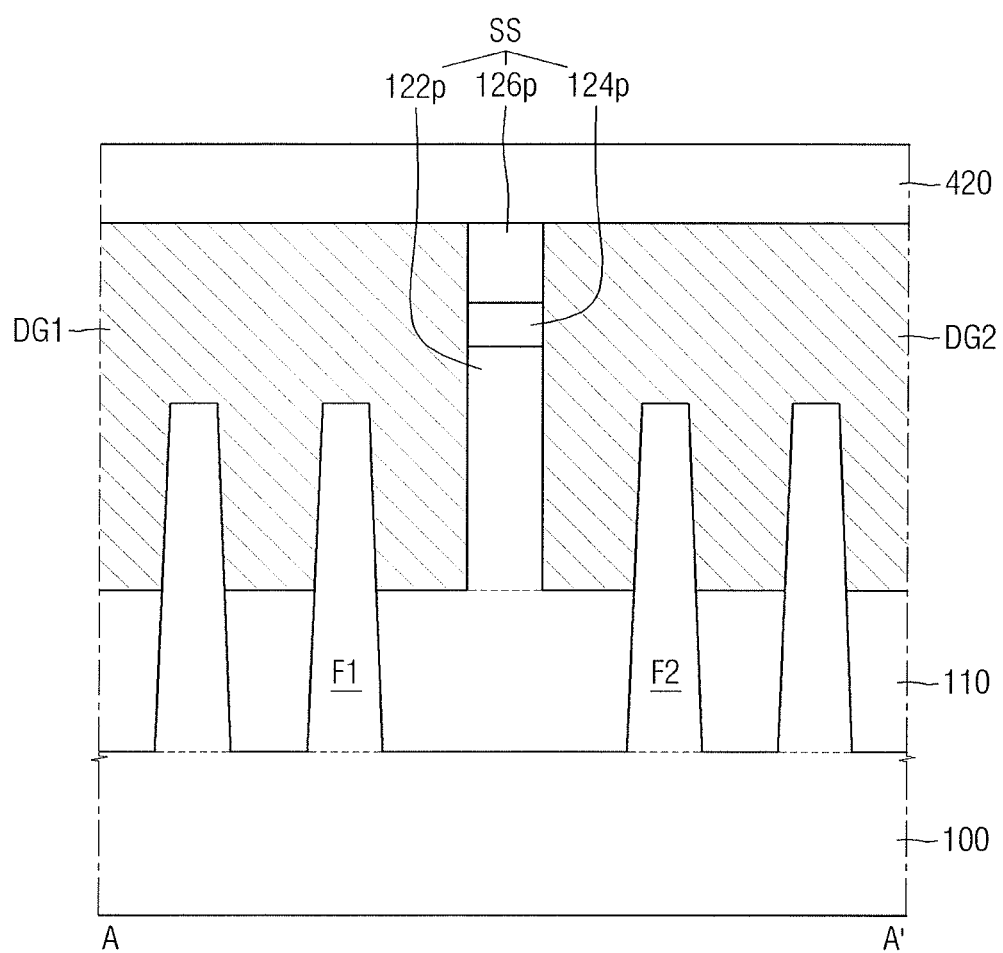
Figure 40A:
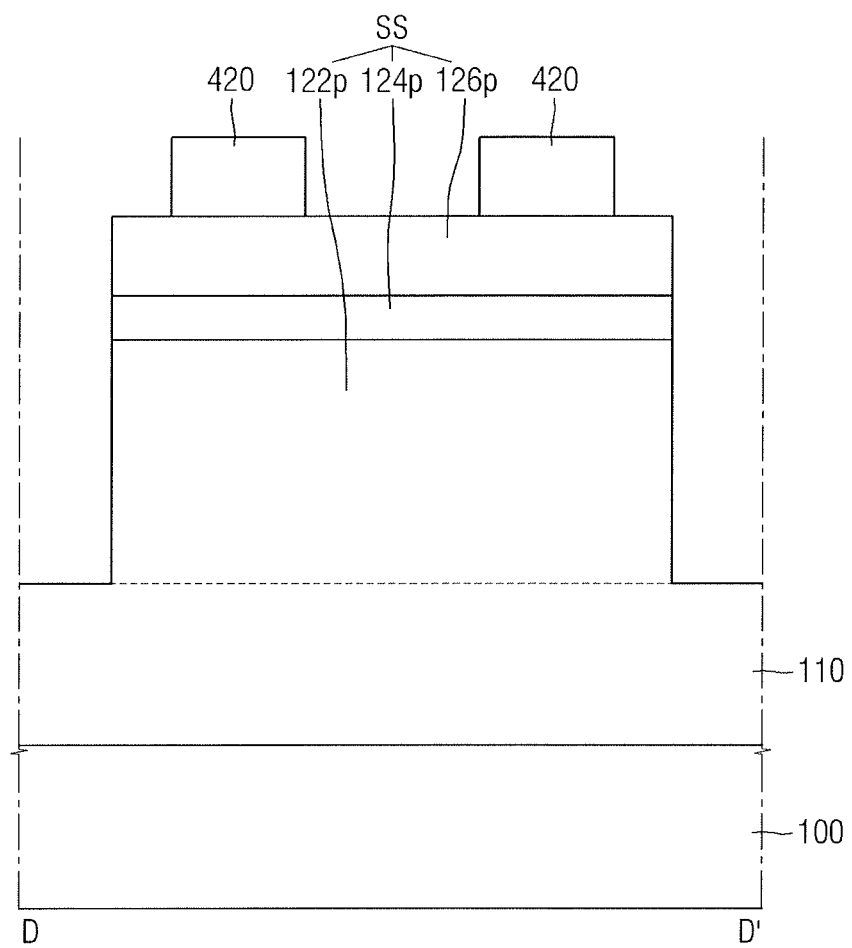
Figure 40B:
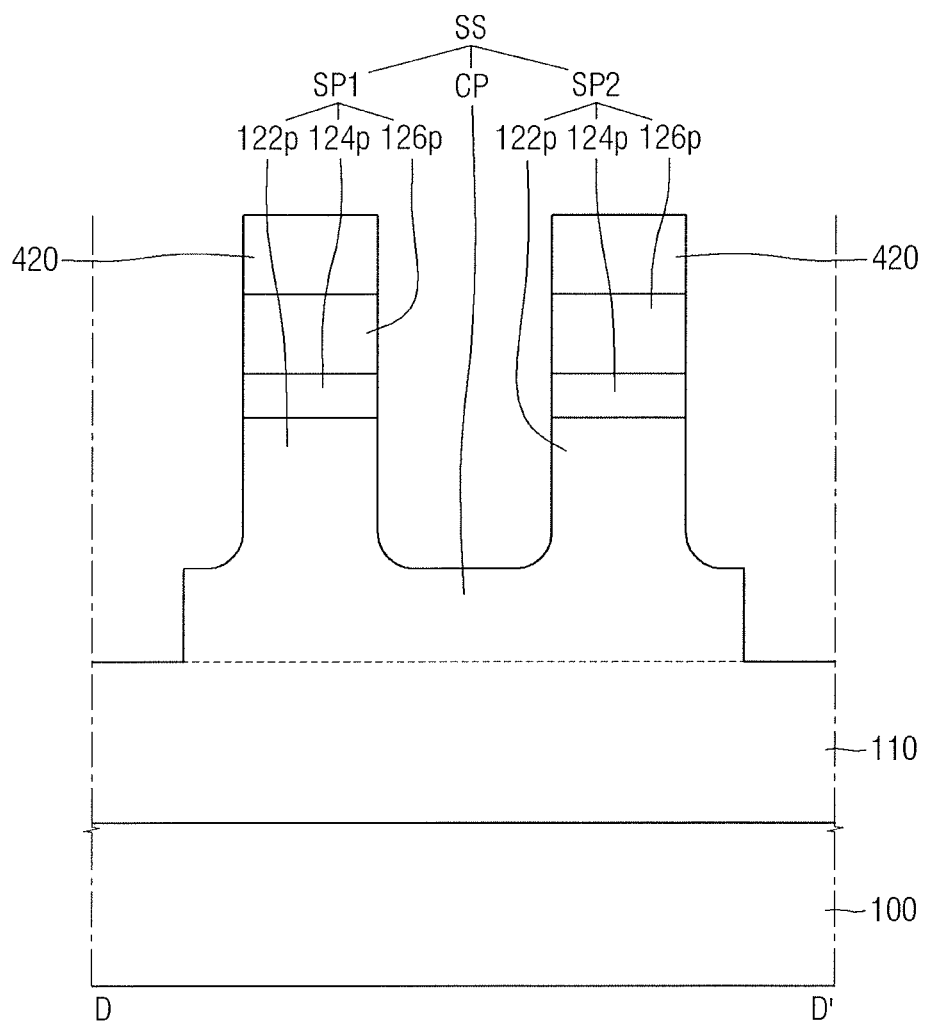

Referring to FIGS. 38 and 40B, in some example embodiments, the separating structure SS may be partially etched by the second etching process.

For example, as illustrated in FIG. 40B, parts of the separating structure SS exposed by the second mask patterns 420 may be etched. Accordingly, the separating structure SS, which includes a first separating portion SP1, a second separating portion SP2, and a connecting portion CP, may be formed. The top surface of the connecting portion CP may be lower than the top surfaces of the first and second separating portions SP1 and SP2.

In some example embodiments, the separating structure SS may not include the connecting portion CP. Thus, the second etching process may be continued until the field insulating film 110 is exposed between the first and second separating portions SP1 and SP2.

Referring to FIGS. 41 through 43A, a spacer 150 is formed on the sidewalls of the first dummy gate structure DG1, the sidewalls of the second dummy gate structure DG2, and the sidewalls of the separating structure SS.

For example, an insulating film may be formed to extend along the profiles of the first and second dummy gate structures DG1 and DG2 and the profile of the separating structure SS. Thereafter, an etch-back process may be performed on the insulating film. Accordingly, the spacer 150 may be formed to extend along the sidewalls of the first dummy gate structure DG1, the sidewalls of the second dummy gate structure DG2, and the sidewalls of the separating structure SS.

Figure 41:
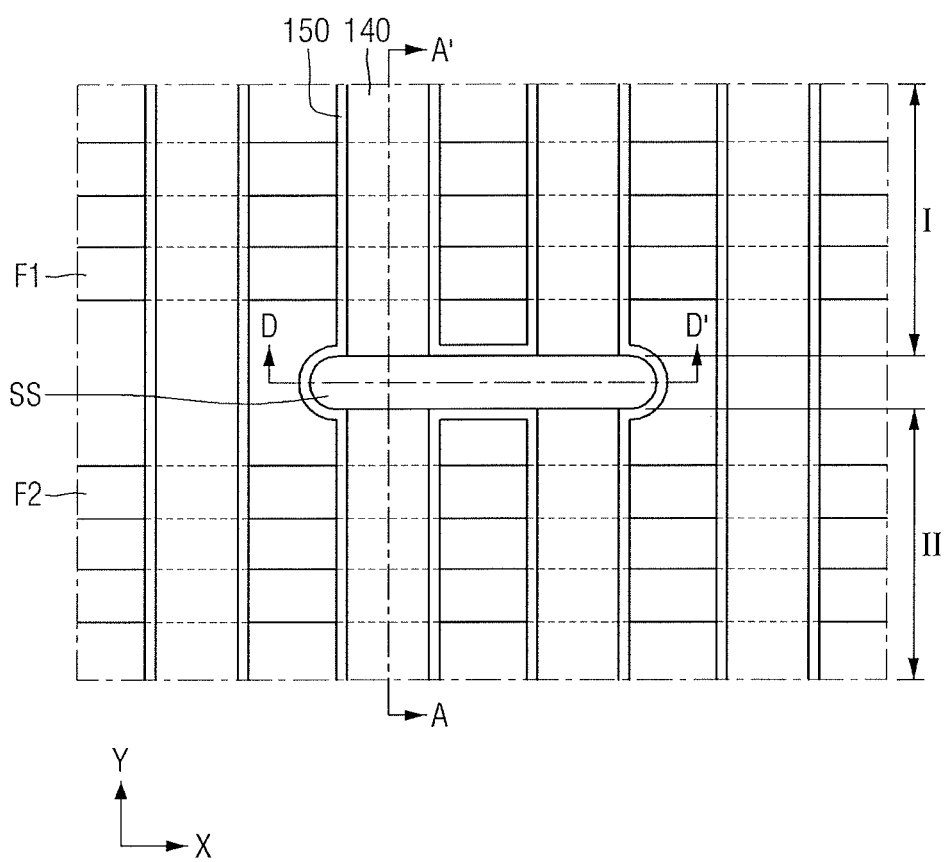
Figure 42:
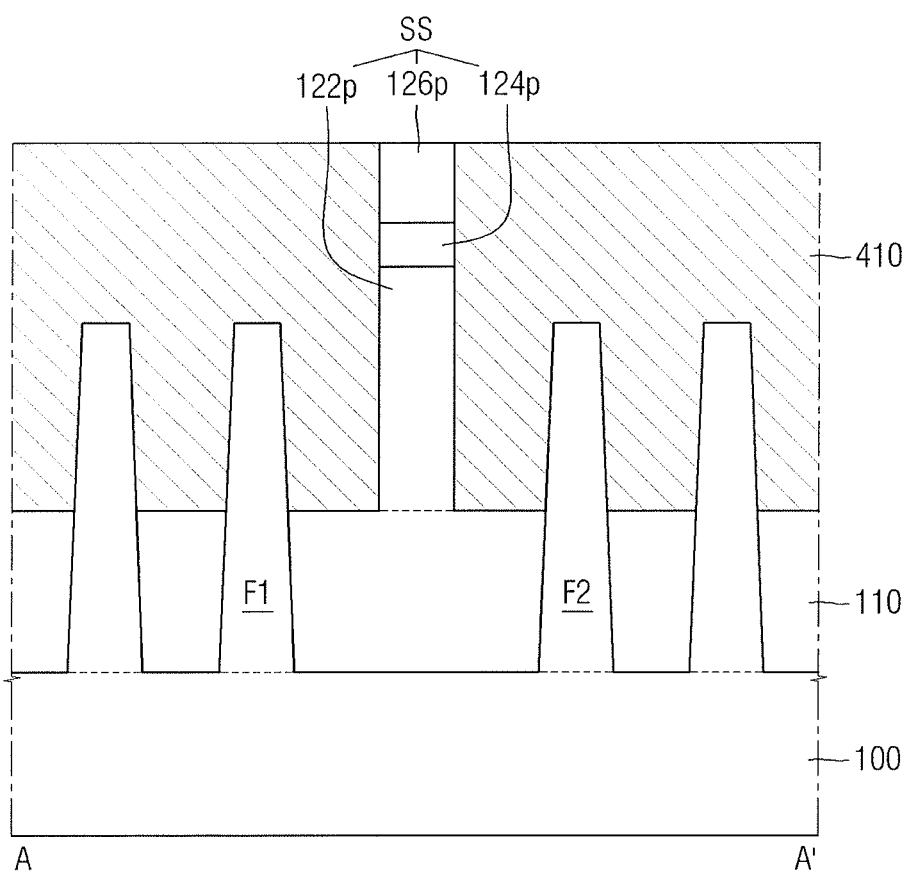
Figure 43A:
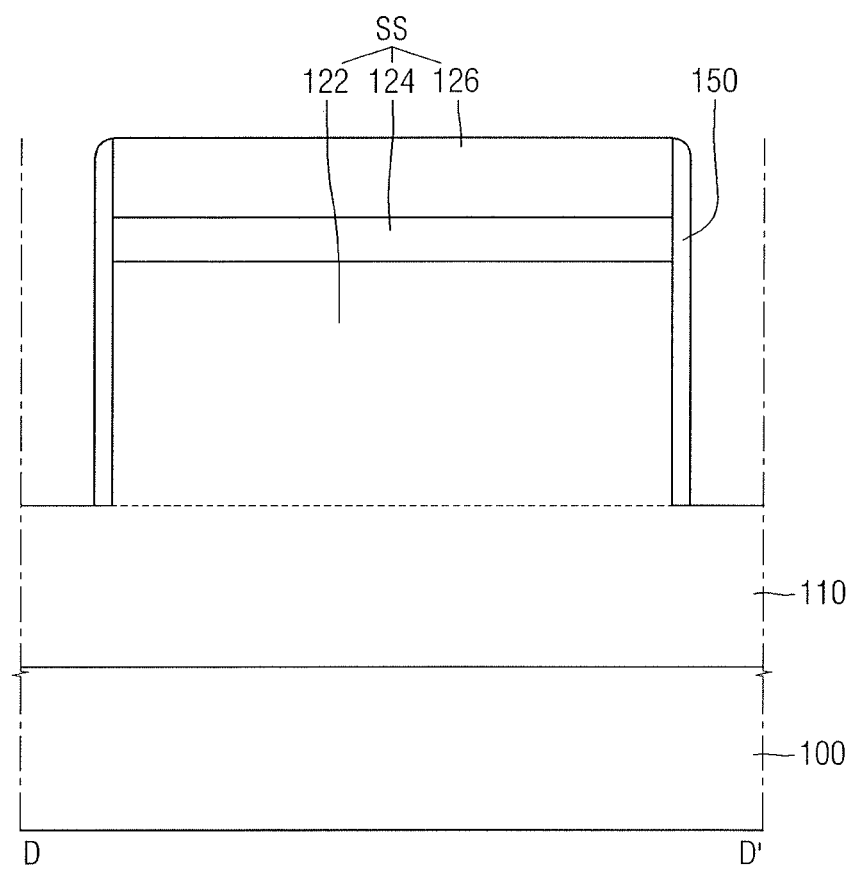
Figure 43B:
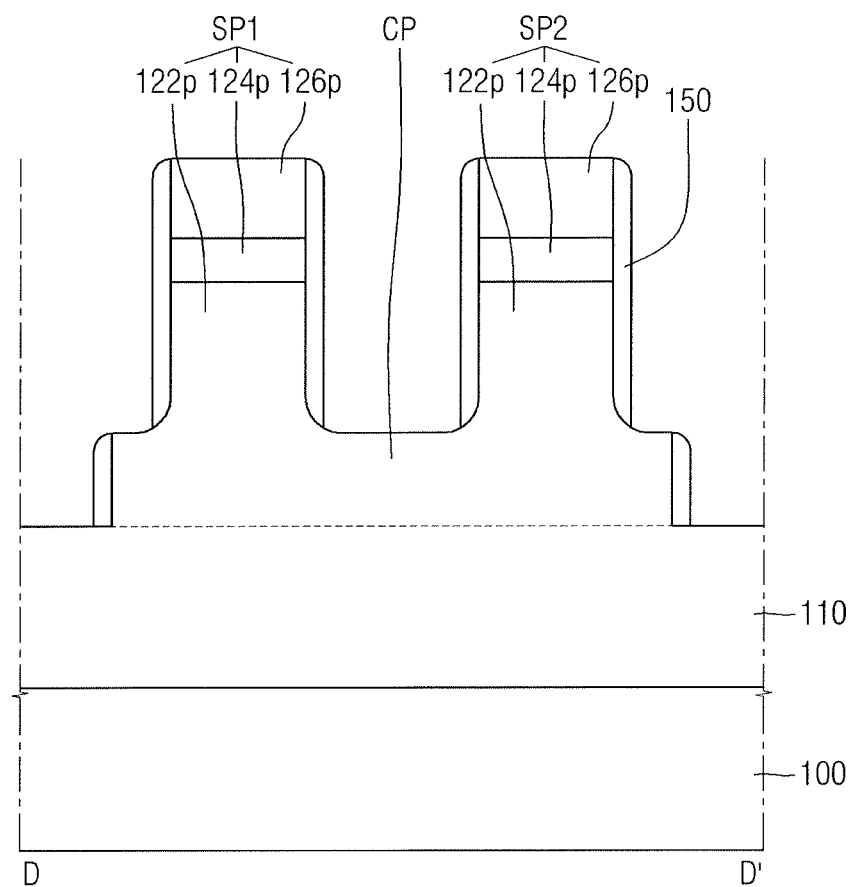

Referring to FIGS. 41 and 43B, in some example embodiments, in a case where the separating structure SS includes the first and second separating portions SP1 and SP2, the spacer 150 may be formed to extend along both sidewalls of the first separating portion SP1 and both sidewalls of the second separating portion SP2.

Thereafter, referring to FIGS. 1 through 6, first and second gate structures G1 and G2 are formed.

For example, the first dummy gate structure DG1 may be replaced with the first gate structure G1, and the second dummy gate structure DG2 may be replaced with the second gate structure G2. For example, a replacement metal gate (RMG) process may be performed.

By way of summation and review, as a semiconductor device is scaled, the isolation of gate structures may become more difficult. For example, the gate structures may be separated by partially cutting the gate structures using an etching process and filling parts of the gate structures that are cut with an insulating material. In this case, however, as the semiconductor device is scaled, the cut parts of the gate structures may not be able to be properly filled with the insulating material, and as a result, defects may be caused in the semiconductor device.

As described above, embodiments relate to a semiconductor device having a separating structure that separates gate electrodes from one another and a method of fabricating the semiconductor device.

A method of fabricating a semiconductor device according to some example embodiments may provide a semiconductor device that may be easily scaled using a separating structure. The separating structure may be formed and then the first and second gate structures, which are separated by the separating structure, may be formed. Thus, in some example embodiments, operations of partially cutting gate structures and filling cut parts of the gate structures with an insulating material may be omitted. Accordingly, the first and second gate structures may be efficiently separated while reducing the distance between first and second fin patterns.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   first and second fin patterns on a substrate and extending apart from each other;
   a field insulating film on the substrate and surrounding parts of the first and second fin patterns;
   a first gate structure on the first fin pattern and intersecting the first fin pattern;
   a second gate structure on the second fin pattern and intersecting the second fin pattern; and
   a separating structure protruding from a top surface of the field insulating film and separating the first and second gate structures, wherein:
   the separating structure includes a first insulating pattern, which projects from the top surface of the field insulating film, a second insulating pattern, which is stacked on a top surface of the first insulating pattern, and a third insulating pattern, which is stacked on a top surface of the second insulating pattern,
   the field insulating film and the first insulating pattern of the separating structure include a same oxide,
   the second insulating pattern of the separating structure includes a nitride, and
   the third insulating pattern of the separating structure is a different material from the second insulating pattern of the separating structure.

2. The semiconductor device as claimed in claim 1, wherein the top surface of the second insulating pattern is higher than top surfaces of the first and second fin patterns.

3. The semiconductor device as claimed in claim 1, further comprising a spacer that contacts and extends along sidewalls of the first gate structure, sidewalls of the second gate structure, and sidewalls of the separating structure.

4. The semiconductor device as claimed in claim 1, wherein a width of the separating structure gradually decreases away from the top surface of the field insulating film.

5. The semiconductor device as claimed in claim 1, wherein:
   the field insulating film includes a first sub-field insulating film, which is in contact with sidewalls of the first fin pattern and sidewalls of the second fin patterns, and a second sub-field insulating film, which is on the first sub-field insulating film, and
   the second sub-field insulating film and the separating structure include a same oxide.

6. The semiconductor device as claimed in claim 1, wherein:
   the substrate includes a first trench, which is defined by sidewalls of the first fin pattern and sidewalls of the second fin pattern, and
   the field insulating film fills a part of the first trench between the first and second fin patterns.

7. The semiconductor device as claimed in claim 6, wherein:
   the substrate further includes a second trench, which is between the first and second fin patterns and lower than a bottom surface of the first trench,
   the field insulating film further fills the second trench, and
   the separating structure overlaps with the second trench.

8. The semiconductor device as claimed in claim 1, further comprising:

an epitaxial pattern formed on a sidewall of the first gate structure,
wherein at least a part of the sidewall of the epitaxial pattern extends along a sidewall of the separating structure.

9. The semiconductor device as claimed in claim 1, wherein a top surface of the separating structure is disposed substantially on a same plane as top surfaces of the first and second gate structures.

10. A semiconductor device, comprising:
first and second fin patterns on a substrate and extending apart from each other;
a field insulating film on the substrate and surrounding parts of the first and second fin patterns over the substrate;
a first gate structure on the first fin pattern and intersecting the first fin pattern;
a second gate structure on the second fin pattern and intersecting the second fin pattern;
a third gate structure on the first fin pattern and intersecting the first fin pattern, and extending apart from the first gate structure;
a fourth gate structure on the second fin pattern and intersecting the second fin pattern, and extending apart from the second gate structure; and
a separating structure between the first and second fin patterns and separating the first and second gate structures, and separating the third and fourth gate structures, wherein:
the separating structure includes a first insulating pattern, which projects from a top surface of the field insulating film, a second insulating pattern, which is stacked on a top surface of the first insulating pattern, and a third insulating pattern, which is stacked on a top surface of the second insulating pattern,
the field insulating film and the first insulating pattern of the separating structure are a single integral body with each other, and
the second insulating pattern of the separating structure is a different material from the field insulating film, the first insulating pattern and the third insulating pattern, and includes a nitride.

11. The semiconductor device as claimed in claim 10, wherein the field insulating film and the separating structure include a same oxide.

12. The semiconductor device as claimed in claim 10, wherein:
the separating structure includes a first separating portion, which separates the first and second gate structures, and a second separating portion, which separates the third and fourth gate structures, and
the first and second separating portions are not in contact with each other.

13. The semiconductor device as claimed in claim 10, wherein, the separating structure includes a first separating portion, which separates the first and second gate structures, a second separating portion, which separates the third and fourth gate structures, and a connecting portion, which connects the first and second separating portions.

14. The semiconductor device as claimed in claim 13, wherein a top surface of the connecting portion is lower than top surfaces of the first and second separating portions.

15. The semiconductor device as claimed in claim 10, further comprising:
a first epitaxial pattern formed on a sidewall of the first gate structure; and
a second epitaxial pattern formed on a sidewall of the second gate structure,
wherein the first and second epitaxial patterns are separated by the separating structure.

16. The semiconductor device as claimed in claim 10, further comprising:
a first epitaxial pattern formed on a sidewall of the first gate structure; and
a second epitaxial pattern formed on a sidewall of the second gate structure,
wherein the first epitaxial pattern includes P-type impurities, and
the second epitaxial pattern includes N-type impurities.

17. A semiconductor device, comprising:
first and second fin patterns spaced apart on a substrate and each extending in a first direction;
a field insulating film on the substrate and surrounding parts of the first and second fin patterns;
a first gate structure on the first fin pattern and extending in a second direction intersecting the first fin pattern;
a second gate structure on the second fin pattern and extending in the second direction intersecting the second fin pattern;
a separating structure extending on the substrate in the first direction, and interposed between and separating the first and second gate structures; and
a spacer that extends along sidewalls of the first gate structure, sidewalls of the second gate structure, and sidewalls of the separating structure wherein:
the separating structure includes a first insulating pattern, which projects from a top surface of the field insulating film, a second insulating pattern, which is stacked on a top surface of the first insulating pattern, and a third insulating pattern, which is stacked on a top surface of the second insulating pattern,
the field insulating film and the first insulating pattern of the separating structure include a same oxide,
the second insulating pattern of the separating structure includes a nitride, and
the third insulating pattern of the separating structure is a different material from the second insulating pattern of the separating structure.

18. The semiconductor device as claimed in claim 17, wherein a lowermost extent of the nitride of the second insulating pattern is farther away from the substrate than an uppermost extent of the first and second fin patterns.

* * * * *